United States Patent [19]
Ohbayashi et al.

[11] Patent Number: 5,223,744
[45] Date of Patent: Jun. 29, 1993

[54] SEMICONDUCTOR INTEGRATED CIRCUIT WITH CIRCUITS FOR GENERATING STABLE REFERENCE POTENTIAL

[75] Inventors: Shigeki Ohbayashi; Atsushi Ohba; Kenji Anami, all of Hyogo, Japan

[73] Assignee: Mitsubishi Denki Kabushiki Kaisha, Tokyo, Japan

[21] Appl. No.: 680,185

[22] Filed: Apr. 3, 1991

[30] Foreign Application Priority Data

Jun. 19, 1990 [JP] Japan .................. 2-160846

[51] Int. Cl.$^5$ ............................ H03K 3/01; H03K 3/26
[52] U.S. Cl. ................................... 307/296.6; 307/303; 307/465.1
[58] Field of Search ................. 307/303, 303.1, 303.2, 307/443, 465.1, 296.1, 296.6; 365/189.09

[56] References Cited

U.S. PATENT DOCUMENTS

| | | | |
|---|---|---|---|
| 4,626,771 | 12/1986 | Williams | 307/296.6 |
| 4,678,935 | 7/1987 | Nawata et al. | 307/296.6 |
| 4,851,721 | 7/1989 | Okitaka | 307/570 |
| 4,904,887 | 2/1990 | Sugiyama et al. | 307/296.6 |
| 4,990,797 | 2/1991 | Real et al. | 307/303 |
| 5,001,362 | 3/1991 | Tran | 307/443 |
| 5,029,280 | 7/1991 | Yee et al. | 307/465.1 |

FOREIGN PATENT DOCUMENTS

3805811 9/1988 Fed. Rep. of Germany .

OTHER PUBLICATIONS

Hiep Van Tran, "BiCMOS Current Source Reference Network for ULSI BiCMOS with ECL Circuitry", ISSCC Digest of Technical Papers (Feb. 16, 1989), pp. 120-121.

Primary Examiner—David R. Hudspeth
Assistant Examiner—Andrew Sanders
Attorney, Agent, or Firm—Lowe, Price, LeBlanc & Becker

[57] ABSTRACT

A semiconductor integrated circuit includes a plurality of emitter-coupled logic (ECL) circuits (10) and circuitry (5, 6a, 6b) generating a reference potential to determine the logic threshold value of the ECL circuits. The reference potential generating circuitry is provided near a first pad (2) for a first supply voltage (VCC) and includes a circuit (5) for generating a first reference potential from the first supply voltage, and a circuit (6a, 6b) provided one for each the group of ECL circuits and provided near an associated ECL circuit group for generating a second reference potential from the first reference potential to generate a reference potential as the logic threshold potential of a corresponding ECL circuit. The semiconductor integrated circuit further includes a first clamping potential generating circuit (16) provided near the first pad for generating a first clamping potential in response to the first supply voltage, and a first clamping circuit (113) for clamping the potential at a node of current/voltage converting resistance element (205, 206) included in the ECL circuits at a first voltage in response to the first clamping potential.

18 Claims, 10 Drawing Sheets

SEMICONDUCTOR INTEGRATED CIRCUIT WITH CIRCUITS FOR GENERATING STABLE REFERENCE POTENTIAL

BACKGROUND OF THE INVENTION

1. Field of the Invention

The present invention relates to a semiconductor integrated circuit, and more particularly to a semiconductor integrated circuit comprising logic circuitry which is operated in such a current mode to switch a current path thereof according to an applied signal.

2. Description of the Related Art

In general, semiconductor integrated circuits include logic circuits which executes desired logic operations on applied input signals. Such semiconductor integrated circuits are generally classified into a bipolar integrated circuit, a MOS (insulated gate) integrated circuit, and a BiCMOS integrated circuit (integrated circuit fabricated by combining bipolar transistors, p-channel MOS transistors and n-channel MOS transistors together) according to the type of transistors used as components.

The semiconductor integrated circuits are also grouped into a TTL logic circuit, an ECL logic circuit and a MOS logic circuit according to the potential or voltage levels for providing two possible status, "0" and "1" as the logic level. The TTL logic circuit is a circuit operating in a TTL level, which input "L" level is of the order of 0.8 V and which input "H" level is of the order of 2.0 V. In the ECL logic circuit, the input level of "L" is $-1.7$ V and the input level of "H" is $-0.9$ V. The MOS logic circuit is a circuit operating in a MOS level, whose input "L" level is of the order of 2.0 V and whose input "H" level is of the order of 4.0 V. The semiconductor integrated circuit including a logic circuit operating in an ECL level will be discussed in the below description. However, if a semiconductor integrated circuit includes, at an input stage thereof, a current switching circuit in which a current path is switched according to an input signal, any type of semiconductor integrated circuits may be referred to.

FIG. 1 is a diagram showing one example of the layout of a conventional semiconductor integrated circuit operated by a signal of an ECL level, which is fabricated on a chip. As one example of the semiconductor integrated circuit, an ECL RAM including a random-access memory as an internal function circuit is shown in FIG. 1.

Referring to FIG. 1, a memory cell array 1 for storing information is arranged in the center of a RAM chip 100. The memory cell array 1, although not shown, is provided with a plurality of memory cells arranged in the form of a matrix of rows and columns. An input-/output signal of the RAM chip 100 is at an ECL level.

There are provided a plurality of input signal pads 9 for receiving input signals of ECL levels and input buffer circuits 10 provided in association with the input signal pads 9 along the outer periphery of the RAM chip 100. One of the input buffer circuits 10 receives a signal fed from an associated input signal pad 9 to perform a buffer processing on the signal, thereby generating an internal input signal. A specific arrangement of the input buffer circuit 10 will be described later. In the following description, a logic circuit receiving an externally applied signal or supplying a signal externally is particularly referred to as an input or output buffer circuit. That is, a buffer circuit is one of logic circuits.

In order to supply operating supply voltage to the ECL-RAM, the RAM chip 100 is also provided with a first power supply pad (hereinafter called merely "VCC pad") 2 to be supplied with a first supply voltage VCC, and a second power supply pad (hereinafter called merely "VEE pad") 3 to be supplied with a second supply voltage VEE>.

Internal VCC power supply interconnections 4 are provided along the outer periphery of the RAM chip 100. The internal VCC power supply interconnections 4 connect the VCC pad 2 to each of the input buffer circuits 10, and supply the first supply voltage VCC applied to the VCC pad 2 to each of the input buffer circuits 10.

A reference potential generating circuit 11 for generating a reference potential VBB1 of a predetermined voltage level is provided near the VCC pad 2. The reference potential VBB1 generated by the reference potential generating circuit 11 is supplied to each of the input buffer circuits 10 through a reference potential VBB1 interconnection (hereinafter called merely "VBB interconnection") 8.

Internal VEE interconnections 12, which extend from the VEE pad 3, are connected to the respective input buffer circuits 10 in order to supply the second supply voltage VEE thereto. However, FIG. 1 shows only parts of the internal VEE interconnections 12 for simplification of the drawing figure.

The RAM chip 100 includes an address decoder used to select a particular address in the memory cell array 1 in response to a signal from one of the input buffer circuits 10, a data write circuit for writing data into the memory cell array 1, a data read circuit for reading out data therefrom, and peripheral circuits such as a circuit for outputting data from the data read circuit to an outside of the RAM chip 100, etc. However, they are also omitted for simplification of the drawing figure.

The reference potential VBB1 generated by the reference potential generating circuit 11 is used as an input logic threshold value in the input buffer circuits 10. An input signal applied to an input buffer circuit 10 through an associated input signal pads 9 is subjected to buffer processing when the reference potential VBB1 is used as the logic threshold value.

In the semiconductor integrated circuit which deals with the signal of the ECL level, the first supply voltage VCC supplied to the VCC pad 2 is ground potential (0 V), and the second supply voltage VEE supplied to the VEE pad 3 is $-4.5$ V or $-5.2$ V.

FIG. 2 is a diagram showing one example of the arrangement of the reference potential generating circuit 11. Referring to FIG. 2, the reference potential generating circuit 11 includes a first reference potential generating circuit hereinafter called merely "VBB0 generating circuit") 5 for generating a first reference potential VBB0 from the power supply voltage VCC fed through the internal VCC interconnection 4, and a second reference potential generating circuit (hereinafter called merely "VBB1 generating circuit") 6 for generating a second reference potential VBB1 in response to the first reference potential VBB0 from the VBB0 generating circuit 5.

The VBB0 generating circuit 5 comprises a resistor 201 having one end connected to the internal VCC interconnection 4 and the other end connected to an internal output node N10 as well as to a constant current source 301 provided between the output node N10 and the internal VEE interconnection 12.

The VBB1 generating circuit 6 includes an npn bipolar transistor 102 for level-shifting the first reference potential VBB0 from the VBB0 generating circuit 5 and a constant current source 303 for supplying constant current to the bipolar transistor 102. The bipolar transistor 102 has a base connected to the output node N10 of the VBB0 generating circuit 5, a collector connected to the internal VCC interconnection 4, and an emitter connected to the constant current source 303 and to an interconnection 8.

The constant current source 303 is provided between the emitter of the bipolar transistor 102 and the internal VEE interconnection 12. The operation of the reference potential generating circuit 11 will now be described below.

In the ECL circuit, the bipolar transistor 102 is operated in an unsaturated region for carrying out a processing operation at high speed. A description will be made later of the construction of each of the constant current sources 301 and 302. The constant current sources 301 and 303 are so constructed that they supply constant current at all times even when the second supply voltage VEE varies. The VBB0 generating circuit 5 outputs the first reference potential VBB0 from the node N10 at one end of the resistor 201. Assuming now that the current supplied in a direction indicated by the arrow in the figure from the constant current source 301 is I301, the resistance value of the resistor 201 is R201 and the voltage at the internal VCC interconnection 4 is V (4), the voltage at the node N10, i.e., the first reference potential VBB0 is given by the following equation:

$$VBB0 = V(4) - I301 \cdot R201$$

Let's also assume that a voltage drop at the internal VCC interconnection 4 between the VCC pad 2 and the reference potential generating circuit 11 is $\Delta V4$. In this case, the voltage at the internal VCC interconnection 4 is given by the following equation:

$$V(4) = VCC - \Delta V4$$

Since VCC=0, the first reference potential VBB0 is represented by the following equation:

$$VBB0 = -I301 \cdot R210 - \Delta V4 \quad (1)$$

The constant current source 303 supplies constant emitter current to the bipolar transistor 102. The bipolar transistor 102 is operated in an emitter follower to reduce the base voltage thereof by the emitter-base voltage VBE (0.8 V or so) to output the same. Thus, the voltage at the emitter of the bipolar transistor 102, i.e., the second reference potential VBB1 is given by the following equation:

$$\begin{aligned} VBB1 &= VBB0 - VBE \\ &= -I301 \cdot R201 - \Delta V4 - VBE \end{aligned} \quad (2)$$

The second reference potential VBB1 is used as the voltage for determining the logic threshold value of the input buffer circuit 10.

FIG. 3 is a diagram showing one example of the arrangement of one of the input buffer circuits 10. In FIG. 3, the input buffer circuit 10 includes an npn bipolar transistor 103 for level-shifting the input signal applied to the input signal pad 9, npn bipolar transistors 104, 105 for switching a current path according to the magnitudes of both the voltage at the emitter of the bipolar transistor 103 and the second reference potential VBB1, a constant current source 305 for supplying constant current to the bipolar transistor 104 and 105, and resistors 203, 204 for converting a current signal produced by the bipolar transistor 104 or 105 into a voltage signal, respectively.

The bipolar transistor 103 has a collector connected to the internal VCC interconnection 4, an emitter connected to the base of the bipolar transistor 104 and a constant current source 304, and a base connected to the input signal pad 9.

The bipolar transistors 104, 105 have emitters connected in common to the constant current source 305. The collector of the bipolar transistor 104 is electrically connected to the internal VCC interconnection 4 through the resistor 203. The collector of the bipolar transistor 105 is also electrically connected to the internal VCC interconnection 4 through the resistor 204. In addition, the base of the bipolar transistor 105 is electrically connected to the internal VBB1 interconnection 8. Internal input signals NA and A are outputted from the collectors of the bipolar transistors 104, 105, respectively.

The internal input signals A and NA are supplied, according to their kinds to an address selecting circuit, a write circuit or a read circuit, which are peripheral circuits of the memory cell array 1.

Each of the constant current sources 304, 305 has the other end connected to the internal VEE interconnection 12 through which current is supplied. The operation of the input buffer circuit 10 will now be described below.

Let's now consider a case where a signal VIH of a high level is supplied to the input signal pad 9. In this case, the signal VIH of the high level is shifted in level by the base-emitter voltage VBE of the bipolar transistor 103, and thereafter supplied to the base of the bipolar transistor 104. In the ECL circuit, all current substantially flows only in a bipolar transistor receiving a greatest base voltage, out of bipolar transistors whose emitters are connected in common. The remaining bipolar transistors therein supply little current. Such two states are referred to as "ON" and "OFF" states, respectively, in the below description.

The voltage at the base of the bipolar transistor 104 is VIH−VBE, while the voltage at the base of the bipolar transistor 105 is V (8). Here, the base voltage V (8) is equal to VBB1−$\Delta$V8 [i.e., $V(8) = VBB1 - \Delta V8$], and $\Delta$V8 represents the amount of a voltage drop along the interconnection 8. If the base voltage of the bipolar transistor 104 is higher than that of the bipolar transistor 105, the transistor 104 is brought into the "ON" state. As a consequence, the current flows in a current path of the resistor 203, the bipolar transistor 104 and the constant current source 305, while no current flows through the resistor 204. Therefore, the voltage at the collector of the bipolar transistor 104 is rendered low in level, and the voltage at the collector of the bipolar transistor 105 is rendered high in level, whereby complementary internal signals NA and A are produced.

When the voltage of the signal inputted to the input signal pad 9 is in a low level VIL, the base voltage of the bipolar transistor 104 is brought into VIL−VBE. If (VIL−VBE) is smaller than V (8), the transistor 104 is brought into the "OFF" state, and the transistor 105 is brought into the "ON" state. As a consequence, the collector voltage of the bipolar transistor 104 is rendered high in level and the collector voltage of the bipolar transistor 105 is rendered low in level. Accordingly, the internal signal NA is brought into a high level and the internal signal A is brought into a low level.

The level of each of the internal input signals A, NA is determined by the level of the signal applied to the input signal pad 9 and the base voltage V (8) of the bipolar transistor 105. This means that the base voltage V (8) of the bipolar transistor 105 determines the logic threshold value of the input buffer circuit 10. If the base voltage V (8) of the bipolar transistor 105 meets the relation represented by the following inequality (3):

$$VIL - VBE < V(8) < VIH - VBE \quad (3)$$

the input buffer circuit 10 is normally operated so as to generate the internal input signals A, NA corresponding to the level of the input signal.

Even when the base voltage V (8) of the bipolar transistor 105 meets the above inequality (3), in the following relation:

$$V(8) - (VIL - VBE) \neq -V(8) + (VIH - VBE)$$

the switching speed of the input buffer circuit 10 differs from a case where the input signal is the high level VIH to a case where it is the low level VIL. Since the switching speed of the input buffer circuit 10 is determined by a slowest switching speed therein, its switching speed becomes slow, thereby deteriorating a high-speed response characteristic of the input buffer circuit 10. Since the operation margin of the input buffer circuit 10 is also determined by a smallest difference between the base voltage V (8) and the level of an input signal, its operation margin is also made small. Assuming that the voltage drop at the interconnection 8 is $\Delta V8$, the base voltage V (8) of the bipolar transistor 105 is obtained from the equation (2) as follows:

$$V(8) = VBB1 - \Delta V4 - \Delta V8 \quad (4)$$

From the standpoint of the high-speed response characteristic and the operation margin, the ideal state is a state that the base voltage V (8) of the bipolar transistor 105 is set to an intermediate level between the high and low levels of the base voltage of the bipolar transistor 104, i.e., to the level of the voltage represented by the following expression:

$$\{(VIH - VIL)/2\} - VBE \quad (5)$$

The arrangement and operation of each of the constant-current sources 301, 303, 304, 305 will now be described. Any one of circuits shown in FIGS. 4A through 4C may be used as the constant current source.

The constant current source shown in FIG. 4A is comprised of an npn bipolar transistor 401 and a resistor 410. The bipolar transistor 401 has a collector connected to a current supply node 20, a base connected to a constant bias voltage VCS, and an emitter connected to one end of the resistor 410. The other end of the resistor 410 is connected to the internal VEE interconnection 12. The current supply node 20 is connected to the resistors or the emitters of the bipolar transistors shown in FIGS. 2 and 3. Assuming that the current supplied to the current supply node 20 is I, the current I is given by the following equation:

$$\begin{aligned} I &= -(1/R410)\{V(12) - (VCS - VBE)\} \\ &= -a \cdot (V(12) - VCS + VBE) \\ &= -a \cdot (VEE + \Delta V12 + VBE - VCS) \\ &= a \cdot (VDIF - \Delta V12 - VBE), V_{DIF} = V_{CS} - V_{EE} \end{aligned} \quad (6)$$

where $\Delta V12$ represents the amount of a voltage drop over the internal VEE interconnection 12, "a" shows a positive proportion constant and R410 denotes the resistance value of the resistor 410. In the equation (6), the constant bias voltage VCS is generated so as to cancel the variation in the second internal supply voltage VEE (where VDIF is kept constant), and the current produced by this constant current source is kept constant at all times if the voltage drop $\Delta V12$ over the internal VEE interconnection 12 is neglected.

The constant current source shown in FIG. 4B includes an n-channel MOS transistor 402. The MOS transistor 402 has a gate supplied with a constant bias voltage VCS, one conduction terminal connected to the current supply node 20, and the other conduction terminal connected to the internal VEE interconnection 12. When the MOS transistor 402 is operated in a triode region, the drain current of the MOS transistor 402 is proportional to the square of the difference in voltage between the gate and source thereof. Therefore, the current I supplied to the current supply node 20 from the constant current source shown in FIG. 4B is given by the following equation:

$$I = K \cdot (VDIF - \Delta V12)^2$$

The constant current source shown in FIG. 4C is a current-mirror type constant current circuit, which includes npn bipolar transistor 403, 404. The bipolar transistor 403 has a collector connected to a bias voltage VCS supply node through a resistor 411, a base connected to the collector thereof and to the base of the npn bipolar transistor 404, and an emitter connected to the internal VEE interconnection 12. The bipolar transistor 404 has a collector connected to the current supply node 20, a base to the base and collector of the npn bipolar transistor 403, and an emitter connected to the internal VEE interconnection 12. This constant current source supplies the same current amount as that which flows through the resistor 411 to the current source node 20. The current I thus supplied is given by the following equation:

$$\begin{aligned} I &= a \cdot (-VEE - \Delta V12 - VBE + VCS) \\ &= a \cdot (VDIF - \Delta V12 - VBE) \end{aligned}$$

The arrangement and operation of a circuit for generating the constant voltage VCS will next be described below.

FIG. 5 is a diagram showing one example of the arrangement of the circuit for generating the constant voltage VCS. Referring to FIG. 5, the VCS generating circuit includes npn bipolar transistors Q1, Q2, Q3, Q4 and Q5, and resistors R1, R2, R3, R4 and R5.

The resistor R1 is connected between the internal VCC interconnection 4 and an internal node N12. The npn bipolar transistor Q1 has a collector connected to the internal node N12, a base connected to an internal node N14, and an emitter connected to the internal VEE interconnection 12. The bipolar transistor Q2 has a base connected to the internal VCC interconnection 4, and an emitter connected to one end of the resistor R2. The bipolar transistor Q3 has a collector connected to the other end of the resistor R2 through the internal node N14 and to the base of the npn bipolar transistor Q1, a base connected to an internal node N15, and an emitter connected to the internal VEE interconnection 12 through the resistor R3.

The npn bipolar transistor Q4 has a collector thereof connected to the internal VCC interconnection 4, a base connected to the internal node N12, and an emitter connected to a VCS output node VCS. Here, the output node and the voltage supplied thereto are denoted by like reference numerals. The npn bipolar transistor Q5 has a collector and a base connected together to the internal node N15 and an emitter connected to VEE interconnection 12. The resistor R4 is connected between the internal output node VCS and the internal node N15. A description will now be made of the operation of the VCS generating circuit.

The VCS generating circuit is constructed such that the difference between the second supply voltage VEE and the constant voltage VCS, i.e., VCS−VEE is kept constant at all times regardless of the variations in the constant voltage VCC and the second supply voltage VEE. Let's now assume that $VDIF = VCS - VEE$. A description will be made below of that VDIF' is kept constant independent of the variations in the supply voltages VCC and VEE, using the equations to be described below. Let's now assume that the base-emitter voltages of the npn bipolar transistors Q1 through Q5 are represented by VBE1 through VBE5, respectively. The current amplification rate β of each of the bipolar transistors Q1 through Q5 is sufficiently large and hence the base potentials thereof can be neglected. Let's also assume that the currents which flow through the resistors R1 through R4 are I1 through I4, respectively.

The difference between the constant voltage VCS and the second supply voltage VEE is given by the sum of the base-emitter voltage VBE5 of the bipolar transistor Q5 and the voltage drop across the resistor R4. Thus, the voltage difference VDIF' is represented by the following equation:

$$VDIF = VCS - VEE \\ = VBE5 + R4 \cdot I4 \quad (a)$$

The difference between the supply voltages VCC and VEE is given by the sum of the voltage drop across the resistor R1 and the base-emitter voltage VBE2 of the bipolar transistor Q2, and the voltage drop across the resistor R2 and the base-emitter voltage VBE1 of the bipolar transistor Q1. Accordingly, the difference therebetween is expressed by the following equation:

$$VCC - VEE = R1 \cdot I1 + VBE2 + R2 \cdot I2 + VBE1 \quad (b)$$

In addition, the difference between the supply voltages VCC and VEE is also given even by the sum of the voltage drop across the resistor R1 and the base-emitter voltage VBE4 of the bipolar transistor Q4, and the voltage drop across the resistor R4 and the base-emitter voltage VBE5 of the bipolar transistor Q5. Thus, the difference therebetween is given by the following equation:

$$VCC - VEE = R1 \cdot I1 + VBE4 + R4 \cdot I4 + VBE5 \quad (c)$$

The voltage drop across the resistor R4 is given by the following equation (d) in accordance with the above equations (b) and (c):

$$R4 \cdot I4 = VBE1 + VBE2 + R2 \cdot I2 - VBE4 - VBE5 \quad (e)$$

Here, the base-emitter voltage VBE5 of the bipolar transistor Q5 is given even by the sum of the base-emitter voltage VBE3 of the bipolar transistor Q3 and the voltage drop across the resistor R3. Therefore, the VBE5 is represented as follows:

$$VBE5 = VBE3 + R3 \cdot I3 \quad (f)$$

As described above, the current which flows into each of the bases of the bipolar transistors Q1 and Q3 is sufficiently small and can be neglected as compared with the currents I2 and I3 which flow through the resistors R2 and R3, respectively. Therefore, the relationship between I2 and I3 can be expressed as follows:

$$I2 \approx I3 \quad (g)$$

The voltage drop across the resistor R2 is given by the following expression in accordance with the equations (f) and (g):

$$R2 \cdot I2 \approx R2 \cdot I3 \\ = (VBE5 - VBE3) \cdot R2/R3 \quad (h)$$

If the equation (h) is substituted in the equation (e), then the equation (e) can be rewritten as follows:

$$VDIF = VBE1 + VBE2 - VBE4 + (VBE5 - VBE3) \cdot R2/R3 \quad (i)$$

Each of the currents I1 through I4 varies according to the variations in the supply voltages VCC and VEE. However, the variations in the base-emitter voltages VBE of the bipolar transistor caused by the current variations are extremely small. It is thus understood from the above equation (i) that the VDIF' is kept constant at all times independent of the variations in the supply voltages VCC and VEE.

Accordingly, if the voltage drop over the internal VEE interconnection can be neglected, the current supplied from each of the constant current sources can always be set to a predetermined value without being affected by the variations in the supply voltages VCC and VEE.

Let's now consider the influence of the variations in the first and second supply voltages VCC and VEE in the semiconductor integrated circuit on the operation of each of the ECL logic circuits.

FIG. 6 schematically shows the layout of supply voltages VCC and VEE interconnections and signal input stage in the conventional semiconductor integrated circuit. FIG. 6 also shows an ECL·RAM as the semiconductor integrated circuit by way of example.

Referring to FIG. 6, a RAM chip 100 is provided thereon with input signal pads 9a, 9b, input buffer circuits 10a, 10b each as one of ECL logic circuits, for receiving an input signal fed from associated input signal pad 9a, and ECL logic circuits 15 each for preforming a predetermined logic operation in response to a signal from associated input buffer circuits 10a, 10b. Since the input buffer circuits 10a, 10b and the ECL logic circuits 15 are symmetrically provided on opposite sides of the RAM chip 100 in FIG. 6, the ECL logic circuits 15 positioned on opposite sides are denoted by the same reference numeral.

The ECL logic circuits 15 receive the input signals from the associated input buffer circuits 10a, 10b through interconnections 17a, 17b, respectively.

In order to supply an operating supply voltage to the input buffer circuits 10a, 10b and the ECL logic circuit 15, internal VCC interconnections 4 extending from a VCC pad 2 are formed on the RAM chip 100 along the outer periphery of the RAM chip 100, and internal VEE interconnections 12 are formed along the outer periphery of a memory cell array 1.

FIG. 7 is a diagram specifically illustrating one example of the arrangement of the input buffer circuits 10a, 10b and the ECL logic circuit 15 shown in FIG. 6.

Referring to FIG. 7, the input buffer circuit 10a is structurally identical to the input buffer circuit 10b. The input buffer circuit (ECL logic circuit) 10a includes npn bipolar transistors 107a, 108a for switching a current path according to the magnitude of a signal applied to the input signal pad 9a and the magnitude of a first reference potential VBB, resistors 205a, 206a for converting current signals fed from the bipolar transistors 107a, 108a respectively into voltage signals, and an npn bipolar transistor 109a for level-shifting a voltage signal produced by the resistor 206a.

The npn bipolar transistors 107a, 108a have emitters connected together to a constant current source 306a. The bipolar transistors 107a, 108a have collectors, respectively, connected to the internal VCC interconnection 4 through the resistors 205a, 206a. The npn bipolar transistors 107a, 108a have bases supplied with an input signal through the input signal pad 9a and a reference potential VBB1 through an internal VBB interconnection 8a, respectively. A constant current source 307a is electrically connected to the emitter of the bipolar transistor 109a.

Similarly, the input buffer circuit (ECL logic circuit) 10b includes npn bipolar transistors 107b, 108b, 109b, constant current sources 306b, 307b, and resistors 205b, 206b. The electrical connections of the input buffer circuit 10b are identical to that of the input buffer circuit 10a. They simply differ in a suffix applied to the reference numerals.

The ECL logic circuit 15 is one of peripheral circuits of the ECL·RAM. The ECL logic circuit 15 includes npn bipolar transistors 110, 111, 112 having emitters connected together, resistors 207, 208, and a constant current source 308. The npn bipolar transistors 110, 111 have collectors, connected in common to one end of the resistor 207. The bipolar transistors 110, 111 have bases supplied with output signals from the input buffer circuits 10b, 10a through the interconnections 17b, 17a, respectively. The other end of the resistor 207 is electrically connected to the internal VCC interconnection 4. The bipolar transistor 112 has a collector connected to the internal VCC interconnection 4 through the resistor 208, and a base supplied with a third reference potential VBB2 through an interconnection 8c. An output signal of the ECL logic circuit 15 is produced at the collector of the bipolar transistor 112.

The constant current sources 306a, 307a, 306b, 307b, 308b are supplied with currents through the internal VEE interconnection 12, and supply the currents to their corresponding transistors. A description will now be made of the operations of the input buffer circuits 10a, 10b.

Since the operations of the input buffer circuits 10a, 10b are identical to each other, the operation of the input buffer circuit 10a will be described below. The operation of each of the input buffer circuits 10a, 10b is the same as that of the input buffer circuit 10 shown in FIG. 3. In this case, an input signal applied to each of the input buffer circuits 10a, 10b is not subjected to the level shifting, and as an alternative it is level-shifted at the output.

When a signal VIH of a high level is inputted to the input signal pad 9a, the bipolar transistor 107a is brought into an "ON" state and the bipolar transistor 108a is brought into an "OFF" state if the signal VIH of the high level is higher in level than the reference potential VBB1. As a consequence, the potential at the collector of the bipolar transistor 108a is rendered high. The collector potential of this bipolar transistor 108a is level-shifted by the base-emitter voltage VBE of the bipolar transistor 109a and then supplied to the interconnection 17a. The voltage V17H of a signal of a high level, which is supplied to the internal output interconnection 17a, is represented by the following equation:

$$V17H = VBE - \Delta V4$$

On the other hand, when a signal VIL of the low level lower than the reference potential VBB1 is applied to the input signal pad 9a, the bipolar transistor 107a is brought into the "OFF" state and the bipolar transistor 108a is brought into the "ON" state. As a consequence, the potential at the collector of the bipolar transistor 108a is rendered low in level and the potential at the emitter of the bipolar transistor 109a, i.e., the output voltage at the internal output interconnection 17a of the ECL logic circuit (input buffer circuit) 10a is also rendered low in level. Assuming now that the resistance value of the resistor 206 is R206, and the current which flows through the constant current source 306a is I306, the potential V17L of a signal of a low level at the internal output interconnection 17a is given by the following equation:

$$V17L = -R206 \cdot I306 - VBE - \Delta V4$$

If VBB1 meets the relation of VIL < VBB1 < VIH, the input buffer circuits 10a, 10b are normally operated. The switching speed of each of the input buffer circuits 10a, 10b becomes faster as the amplitude $V17H - V17L = R206 \cdot I306$ is decreased. The switching speed also becomes slow as the reference potential VBB1 is shifted from the center between the low-level voltage VIL and the high-level voltage VIH.

A description will now be made of the operation of the ECL logic circuit 15. When either one of the outputs 17a and 17b (the internal signal interconnection and signal supplied to the internal signal interconnection are denoted by like reference numerals) of the input buffer circuits 10a, 10b, respectively, is high in level, either one of the bipolar transistors 110, 111 is brought into the "ON" state and the bipolar transistor 112 is brought into the "OFF" state if the high-level potential V17H is higher than the reference potential VBB2. As a consequence, the potential at the collector of the bipolar transistor 112 is rendered high.

When both outputs 17a, 17b of the input buffer circuits 10a, 10b are low in level, the two bipolar transistors 110, 111 are brought into the "OFF" state and the bipolar transistor 112 is brought into the "ON" state if the low-level potential V17L is lower than the reference potential VBB2. As a consequence, the potential at the collector of the bipolar transistor 112 is rendered low.

If the reference voltage VBB2 lies between V17L and V17H (i.e., V17L<VBB2<V17H), the ECL logic circuit 15 is normally operated at all times. The switching speed of the ECL logic circuit 15 becomes faster as the amplitude of output therefrom is decreased as in the case of the input buffer circuits 10a, 10b. The switching speed thereof becomes slower as the reference potential VBB2 is shifted from the center between the low-level voltage V17L and the high-level voltage V17H.

Let's now assume that the current supplied from the constant-current source is kept constant without being affected by the variation in the second supply voltage VEE. As shown in the above equation (8), the reference potential V (8) of the input buffer circuit 10 undergoes a great influence of the voltage drops at the interconnection 8 and the internal VCC interconnection 4. The variation in the reference potential V (8) exerts a great influence on the operation margin and speed of the semiconductor integrated circuit which deals with a signal of the ECL level.

In order to control the variation in the reference potential V (8) of each input buffer circuit, which variation is caused by the supply voltage, process parameters, temperature, or the like, it is necessary to reduce the voltage drops $\Delta V4$, $\Delta V8$ caused by the interconnection resistances as small as possible. The resistor R201, the base-emitter voltage VBE and the like also undergo the influence of the process parameters and temperature. However, it is possible to minimize the variation in the reference potential V (8) to be within the minimum allowable range in design specifications. However, since the interconnections 4, 8 extend over the semiconductor chip and the supply voltages are directly supplied thereto, the reference potential undergoes the greatest influence of these factors.

In addition, since the distances from different input buffer circuits to the VCC pad and the VBB1 generating circuit are different from one another, the voltage drops $\Delta V4$, $\Delta V8$ caused by the interconnection resistances at the interconnections 4, 8 differ for each input buffer circuit. It is therefore necessary to minimize the voltage drops $\Delta V4$, $\Delta V8$ caused by the interconnection resistances even from the above standpoint.

In order to minimize the voltage drop $\Delta V4$ at the internal VCC interconnection 4 to a negligible level, the reference potential generating circuit 11 is normally provided near the VCC pad 2 as shown in FIG. 1.

The length of the interconnection 8 becomes longer with an increase in the scale of the semiconductor integrated circuit. However, since the width of the interconnection 8 cannot be made larger in view of the area of the layout of the semiconductor integrated circuit, the resistance of the interconnection 8 becomes large. The current which flows through the interconnection 8 corresponds to that which flows into the base of each bipolar transistor. However, inasmuch as the number of the input buffer circuits connected to the interconnection 8 are increased in a large-scale semiconductor integrated circuit, the total amount of currents which flow into the bases of the bipolar transistors cannot be neglected. For 64K×4 bit type ECL·RAM, twenty-two input buffer circuits are required. Assuming now that the resistance value of the interconnection 8 is 100 Ω, the base current which flows from one input buffer circuit 10 to the interconnection 8 is 0.05 mA, the voltage drop $\Delta V8$ at the interconnection 8 reaches the maximum 0.11 V from the calculation of $0.05 \cdot 10^{-3} \cdot 100 \cdot 22$. As a consequence, this voltage drop exhibits a large value with respect to 0.8 V representing the amplitude (VIH−VIL) of a signal inputted in the ECL logic circuit. Thus, the voltage drop $\Delta V8$ at the interconnection 8 becomes a greater value in the conventional semiconductor circuit, and hence the variation in the reference potential V (8) which occurs in an integrated circuit or between integrated circuits cannot be neglected, said variation being caused by the supply voltages or the process parameters, or the like. If the reference potential V (8) varies in this way, the operating margin of each input buffer circuit is reduced and the operating speed of each input buffer circuit is slow, thus causing an increase in the delay at the input buffer circuit.

The influence of the voltage drop at the internal VEE interconnection 12 on the current supplied from the constant current source has been neglected in the above discussion. However, such a voltage drop cannot be neglected.

When the constant current sources shown in FIGS. 4A through 4C are used, the values of the currents therefrom are different from each other due to the voltage drop $\Delta V12$ over the internal VEE interconnection 12. When the constant current source shown in FIG. 4A, for example, is used as the constant current source in the ECL logic circuit shown in FIG. 7, the low-level potential V27L of each of the outputs 17a and 17b from the ECL logic circuits (input buffer circuits) 10a, 10b is given by the following equation:

$$V17L = -\alpha \cdot R206 \cdot (VDIF - \Delta V12 - V_{BE}) - VBE - \Delta V4$$

The high-level potential V17H is also given by the following equation:

$$V17H = VBE - \Delta V4$$

It is to be understood that the output levels of the ECL logic circuits 10a, 10b vary according to the voltage drops $\Delta V4$ and $\Delta V12$ at the power supply interconnections, respectively.

In addition, as seen from FIGS. 1 and 6, the internal power supply interconnections 4, 12, which extend from the power supply pads 2, 3, respectively, are different in length from each other with respect to the input buffer circuit 10a, 10b. Therefore, their resistance values are different from each other, and the outputs 17a, 17b generated from the input buffer circuits 10a, 10b, respectively, are different in the voltage drops $\Delta V4$, $\Delta V12$ from each other. Accordingly, the voltage level of the output 17a and the voltage level of the output 17b differ from each other even if they exhibit the same logic value.

When the amplitude of each of the outputs 17a, 17b is decreased to make faster the switching speed of the ECL logic circuit, the range of the reference potential VBB2, i.e., V17L<VBB2<V17H, which is required for operating the ECL logic circuit 15 normally, is made narrower. When the outputs 17a and 17b differ in level from each other in particular, the lower limit of the range of the reference potential VBB2, which is necessary for normally operating the ECL logic circuit 15, is determined by higher one of the low level potentials of the outputs 17a, 17b. On the other hand, the upper limit of the range of the reference potential VBB2 is determined by lower one of the high level potentials of the outputs 17a, 17b. Therefore, the range of the reference potential VBB2, which is required for normally operating the ECL logic circuit 15, is made narrower.

Since the reference potential VBB2 is easily shifted from the center between the high-level potential V17H and the low-level potential V17L owing to some variations in the reference potential VBB2, the operating speed of the ECL logic circuit 15 also become slow. Let's now assume that, for example, the resistance 4c, 12a of the power supply interconnections between the input buffer circuits 10a and 10b are 10 Ω respectively, a preset value a·(VDIF−$V_{BE}$) of the constant current from the constant current source 306 is 1 mA, the difference (VDIF−$V_{BE}$) is 1 V, the resistance value R206 of the resistor 206 is 0.5 KΩ, the power supply current which flows through the internal VCC interconnection 4 is 10 mA, and the power supply current which flows through the internal VEE interconnection 12 is 10 mA. Then, if the above power supply currents flow from the input buffer circuit 10a to the input buffer circuit 10b, the difference between the high-level potential of the output 17a and the high-level potential of the output 17b becomes 0.1 V and the difference between the low-level potential of the output 17a and the low-level potential of the output 17b becomes 0.05 V. In this case, the preset value of the amplitude of each of the outputs 17a and 17b is 0.5 V. However, the range of the reference potential VBB2, which is necessary to normally operate the ECL logic circuit 15, falls within 0.35 V due to the resistance of each internal power supply interconnection.

Accordingly, the conventional semiconductor integrated circuit has the problem that the output level of the ECL logic circuit varies under the influence of the voltage drop caused by the resistance of each power supply interconnection, and the reduction in the amplitude of each output for performing an operation in the ECL logic circuit at high speed cannot be carried out, which reduction is required for acquiring sufficient operating margin and the switching speed of subsequent logic circuitry. This problem is developed more prominently due to the increasing capacity of the semiconductor integrated circuit accompanied with increases in the interconnection length and the current which flows through the interconnection.

The influence of the voltage drops at the above-described power supply interconnections occurs even in the case where the semiconductor integrated circuit includes TTL logic circuitry or MOS logic circuitry as well as where it includes ECL logic circuitry. In addition, their influence also appears not only in the input buffer circuits but also in other arbitrary internal logic circuitry.

The architecture for eliminating the adverse impact of a voltage drop at the power supply interconnection on the reference potential of the ECL logic circuit is disclosed in the article "BiCMOS Current Source Reference Network for ULSI BiCMOS with ECL circuitry", by H. V. Tran et. al. in 1989 IEEE ISSCC Digest of Technical Papers, Feb. 1989, p.p. 120-121. The architecture of the prior art includes a global level reference generator for producing a reference current flowing through a long interconnection line over a chip, and a local level reference generator provided near an associated ECL circuit or an associated constant current source to receive the reference current to thereby produce the reference potential level for application thereof to the associated ECL circuit or current source.

SUMMARY OF THE INVENTION

It is an object of the present invention to provide a semiconductor integrated circuit which eliminates technical shortcomings of a conventional semiconductor integrated circuit and has a wide operating margin and high-speed operation characteristics.

It is another object of the present invention to provide a semiconductor integrated circuit which can carry out the supply of a stable reference potential which undergoes no influence of a voltage drop at an interconnection.

It is a further object of the present invention to provide a semiconductor integrated circuit which can eliminate the influence of a voltage drop at an internal power supply interconnection.

It is a still further object of the present invention to provide a semiconductor integrated circuit which can eliminate the influence of a variation in a power supply voltage on the level of an output from a logic circuit including a current switching circuit.

It is a still further object of the present invention to provide a semiconductor integrated circuit which can supply a stable reference potential to a logic circuit having at its input stage a current switching circuit.

According to a first aspect of the present invention, a semiconductor integrated circuit including a first pad (VCC pad) for receiving an externally supplied first supply voltage (VCC) and a second pad (VEE pad) for receiving a second supply voltage (VEE) comprises: first reference potential generating means (5) provided near the first pad and supplied with the first supply voltage from the first pad through a first interconnection to generate a first reference potential, a plurality of second reference potential generating means (6a, 6b) each supplied with the first reference potential (VBB0) from the first reference potential generating means through one of second interconnections (8a, 8b) to thereby generate a second reference potential, and a plurality of logic circuit means (10) provided in the form of a group in association with each of the plurality of second reference potential generating means.

The plurality of logic circuit means each includes circuit means for logically processing a received signal, using a second reference potential from an associated second reference potential generating means as a logic threshold value.

The logic processing executing circuit means include a current switching circuit for switching a current path according to the magnitudes of both the input signal and the second reference potential.

The second reference potential generating means is connected to an associated logic circuit means group through a third interconnection. Each of the second reference potential generating means is provided near an associated logic circuit means group in such a manner that the interconnection resistance associated with the third interconnection is smaller than that with an associated second interconnection.

According to a second aspect of the present invention, a semiconductor integrated circuit includes logic circuit means having one end supplied with current from a first supply voltage fed from a first power supply pad through a first interconnection and for outputting a signal having different potential levels according to an input signal applied to an input node thereof; constant current supply circuit means for supplying constant current to the other end of the logic circuit means; means for generating a reference potential from the first supply voltage; and clamping circuit means for clamping the potential at said one end of the logic circuit means to a predetermined potential in response to the reference potential thus generated.

The difference between the reference potential and the first power supply potential is set to a fixed value regardless of the variation in the second power supply voltage. The clamping potential of the clamping circuit means is determined by the reference potential. The difference between the clamping potential and the first supply voltage is set to a predetermined, fixed value regardless of the variation in the second power supply voltage.

According to a third aspect of the present invention, a semiconductor integrated circuit comprises: logic circuit means having one end supplied with current from a first power supply voltage fed via a first interconnection and for subjecting an input signal to prescribed logic processing; means for receiving a second power supply voltage through a second power interconnection to generate a first reference potential; constant current circuit means having on end supplied with current from the second power supply voltage and for supplying constant current from the other end thereof to an other end of the logic circuit means in response to the first reference potential; second reference potential generating means for generating a second reference potential from the second power supply voltage; and clamping circuit means for clamping the potential at said one end of each of the constant current circuit means to a predetermined, fixed potential in response to the second reference potential.

The difference between the first reference potential and the second power supply potential is set to a predetermined value regardless of the variation in the second power supply voltage. In addition, the difference between the clamping potential by the clamping circuit means and the second power supply potential is set to a predetermined value regardless of the variation in the second power supply voltage.

According to the first aspect of this invention, the second reference potential generating circuit means is disposed near an associated logic circuit in such a manner that the resistance of the interconnection used to supply the second reference potential to the logic circuit is smaller than that of the interconnection used to supply the first reference potential to the second reference potential generating circuit means. In addition, since the first reference potential generating circuit is provided near the first pad, the first reference potential is rendered stable without being affected by the internal power supply interconnections. It is also possible to minimize the voltage drop caused by the interconnection resistance between the second reference potential generating circuit and its associated logic circuit. Even when a plurality of second reference potential generating circuits are provided, they are provided one by one for each logic circuit group, and the current flowing therethrough is substantially reduced. Therefore, the current flowing through the second interconnection can be restrained thus minimizing the voltage drop at the second interconnection. As a consequence, the voltage drop at the interconnection for the supply of the reference potential can be minimized.

According to the second aspect of this invention, the clamping potential is determined by the reference potential set so as to keep constant the difference between the first supply voltage and the reference potential regardless of the variation in the second power supply voltage, and the level of an output from the logic circuit means is determined by the clamping potential. It is therefore possible to suppress the influence of the voltage drop caused by the interconnection resistance of the first power supply voltage on the output level from the logic circuit means.

According to the third aspect of this invention, the clamping potential is determined by the second reference potential set to keep constant the difference between the second reference potential and the second power supply potential and the clamping potential determines the potential at the current supply node of the constant current source circuit means. It is therefore possible to suppress the influence of the voltage drop caused by the resistance of the second power supply interconnection on the output level of the logic circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
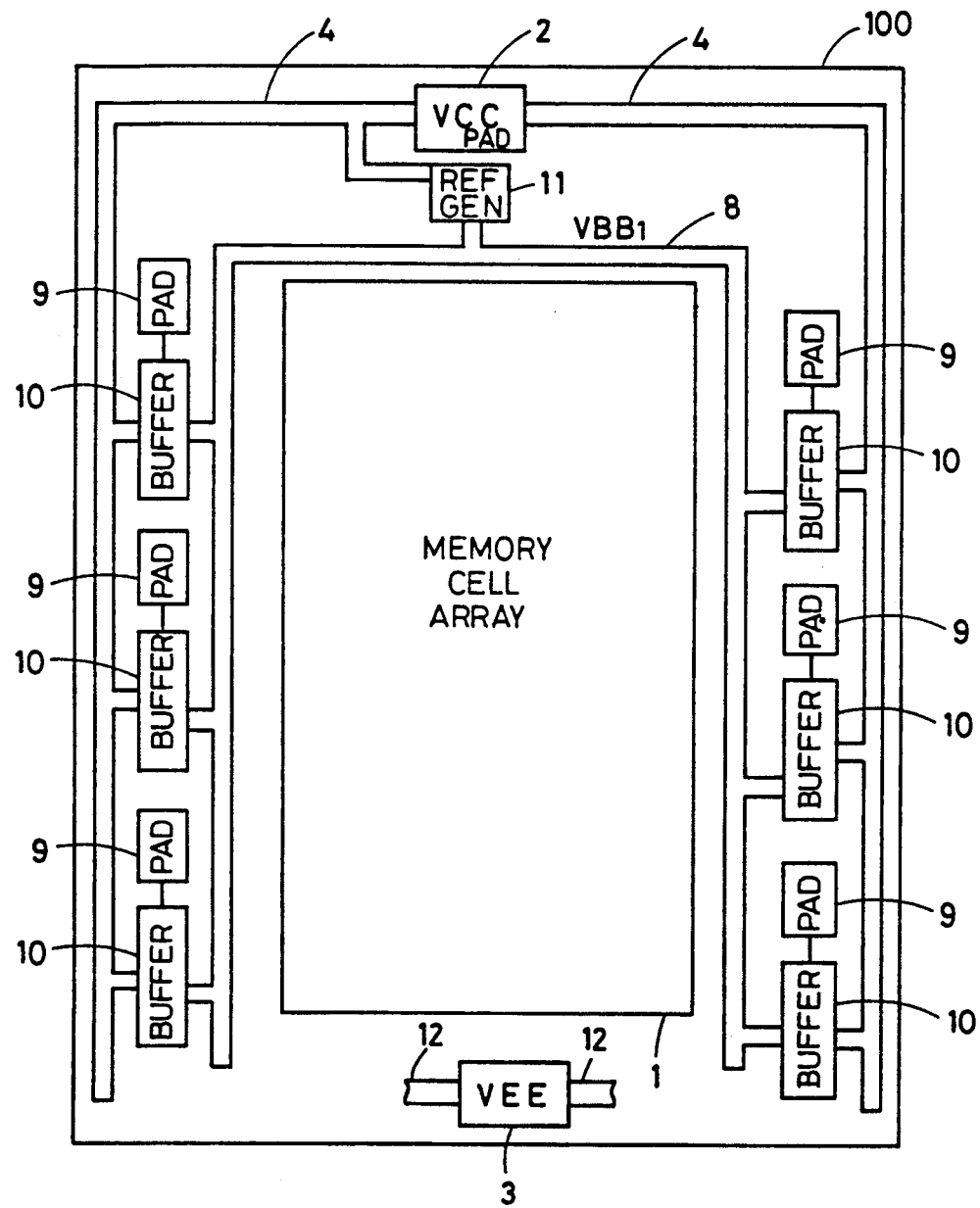
FIG. 1 is a schematic diagram showing the layout of a conventional semiconductor integrated circuit fabricated on a chip.
Figure 8:
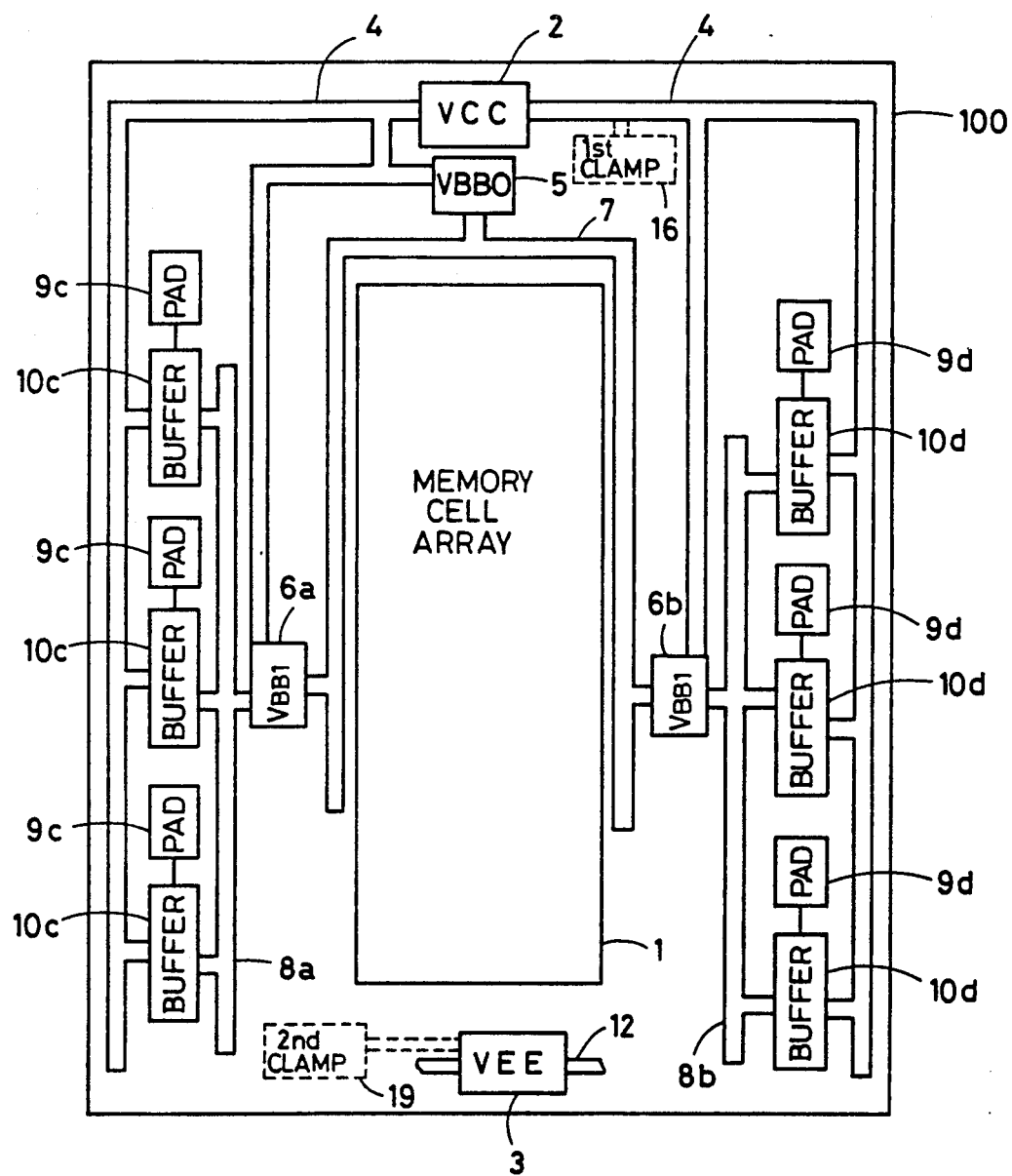
FIG. 8 is a schematic diagram showing the layout of a semiconductor integrated circuit according to one embodiment of the present invention, which is fabricated on a chip.

FIG. 8 schematically shows the layout of a semiconductor integrated circuit according to one embodiment of the present invention, which is fabricated on a chip. In FIG. 8, the components corresponding to those in the conventional semiconductor integrated circuit shown in FIG. 1 are denoted by identical reference numerals. Referring to FIG. 8, the semiconductor integrated circuit according to the present invention is fabricated on a semiconductor chip 100, and includes adjacent to a VCC pad 2, a first reference potential generating circuit (hereinafter called "VBB0 generating circuits") 5 which serve to receive a first reference potential VBB1.

An input buffer circuit 10 is divided into two groups (right- and left-hand side of the chip 100 in FIG. 8), i.e., a first input buffer circuit group 10c and a second input buffer circuit group 10d by way of illustrative example. The VBB1 generating circuit 6a is provided in association with the first input buffer circuit group 10c and supplies the second reference potential VBB1 thereto through an interconnection 8a. The VBB1 generating circuit 6b is provided in association with the second input buffer circuit group 10d and supplies the second reference potential VBB1 thereto through an interconnection 8b. Further, the first power supply voltage VCC is supplied to the VBB1 generating circuits 6a, 6b through internal VCC interconnections 4.

Figure 2:
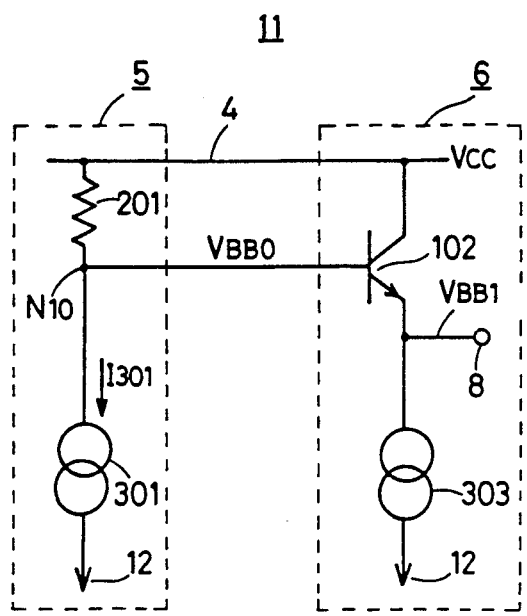
FIG. 2 is a diagram showing the arrangement of a conventional reference potential generating circuit.
Figure 9:
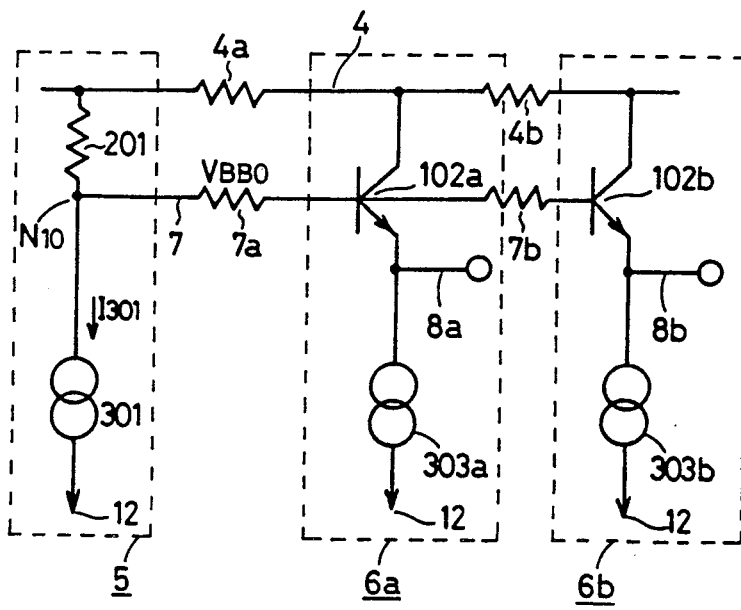
FIG. 9 is a diagram depicting the arrangements of first and second reference potential generating circuits according to said one embodiment of the present invention.

FIG. 9 is a diagram showing the arrangements of the VBB0 generating circuit 5 and the VBB1 generating circuits 6a, 6b employed in the semiconductor integrated circuit according to the present invention. Each of the VBB0 generating circuit 5 and the VBB1 generating circuits 6a, 6b shown in FIG. 9 is structurally identical to a reference potential generating circuit 11 shown in FIG. 2. The components of the VBB0 generating circuit 5 and the VBB1 generating circuits 6a, 6b and those associated therewith corresponding to those of the reference potential generating circuit 11 of FIG. 2 are denoted by identical reference numerals. However, in the circuit arrangement shown in FIG. 9, the first reference potential VBB0 is supplied to the VBB1 generating circuits 6a, 6b through the interconnection 7 from the VBB0 generating circuit 5. Therefore, interconnection resistance 7a, 7b exists in the interconnection 7. Here, FIG. 8 shows where the VBB1 generating circuits 6a and 6b are connected in parallel with the VBB0 generating circuit 5. However, FIG. 9 shows, as the worst case, where the VBB1 generating circuits 6a and 6b are connected in series thereto because the influence of voltage drops caused by the interconnection resistances 7a, 7b of the interconnection 7 is discussed. Similarly, interconnection resistances 4a and 4b exist in the internal VCC interconnection 4. A description will now be made of the operation of the reference potential generating circuit shown in FIG. 9. The VBB0 generating circuit 5 outputs a reference potential VBB0 at one end (a node N10) of a resistor 201. Let's here assume that the drop in voltage caused by the interconnection resistance in the internal VCC interconnection 4 is $\Delta V4$, the resistance value of the resistor 201 is R201, and the constant current of a constant current source 301 is I301. In this case, the first reference potential VBB0 is given by the following equation:

$$VBB0 = -R201 \cdot I301 - \Delta V4$$

The first reference potential VBB0 is supplied through the interconnection 7 to the VBB0 generating circuits 6a and 6b which are comprised of emitter follower circuits, where it is level-shifted by VBE. A second reference potential VBB1 is outputted from each of the emitter of bipolar transistors 102a, 102b. Assuming that the drop in voltage at the interconnection 7 is $\Delta V7$, the second reference potential VBB1 is given by the following equation:

$$VBB1 = VBB0 - VBE - \Delta V4 - \Delta V7$$

Current fed from each of the constant current source 301 and constant current sources 303a, 303b is set in such a manner that it is kept constant at all times regardless of the variation in a second supply voltage VEE.

Figure 3:
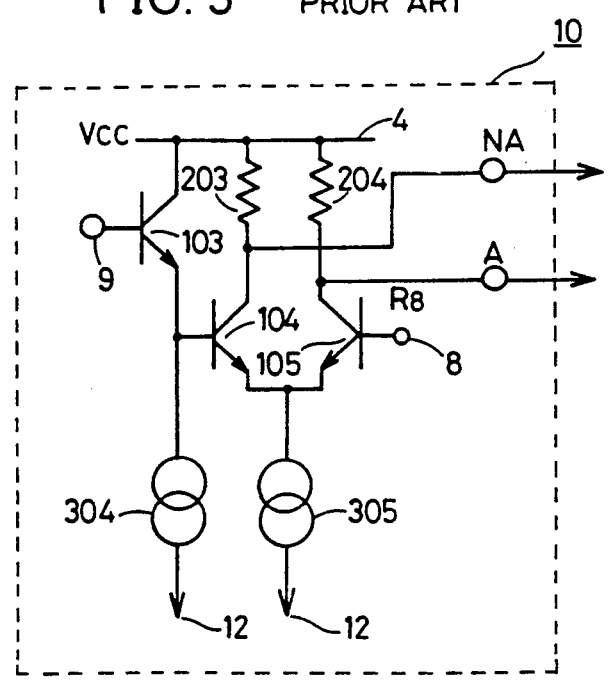
FIG. 3 is a diagram showing the arrangement of an input buffer circuit employed in the conventional semiconductor integrated circuit.

The second reference potential VBB1 generated by each of the VBB1 generating circuits 6a and 6b is supplied to the corresponding input buffer circuit 10 through each of the interconnections 8a and 8b. Let's now assume that the input buffer circuit 10 is structurally identical to that shown in FIG. 3. Assuming that the voltage drop at each of the interconnections 8a, 8b is $\Delta V8$, a reference potential V (8) at the corresponding input buffer circuit 10 is given by the following equation:

$$\begin{aligned} V(8) &= VBB1 - \Delta V8 \\ &= -R201 \cdot I301 - VBE - \Delta V4 - \Delta V7 - \Delta V8 \end{aligned}$$

As described above, the variation in the reference potential V(8) has great influence on the operating margin and speed of the semiconductor integrated circuit which processes a signal of an ECL level. In order to suppress the variation in the reference potential V(8), which is caused by the position where each respective circuit is disposed on the semiconductor chip 100, supply voltages, process parameters and temperature, it is necessary to minimize the voltage drops $\Delta V4$, $\Delta V7$ and $\Delta V8$ in the respective interconnections. With a view toward rendering the voltage drop ΔV4 at the internal VCC interconnection 4 small negligibly, the VBB0 generating circuit 5 is disposed near the VCC pad 2 similarly to the conventional semiconductor integrated circuit. Thus, the resistance of the interconnection between the VCC pad 2 and the VBB0 generating circuit 5 is extremely small, and hence the voltage drop at that portion can be neglected.

The interconnection resistances 7a and 7b exist in the interconnection 7 with respect to each of the VBB1 generating circuits 6a and 6b. However, the VBB1 generating circuit 6a and 6b are respectively provided singly with respect to plural input buffer circuits 10. The number of the bipolar transistors, which are the components of the VBB1 generating circuits 6a and 6b and whose bases are connected to the interconnection 7, are considerably reduced as compared with that of the bipolar transistors, which are the components of the input buffer circuit 10 and whose bases are connected to the interconnections 8a and 8b, respectively. Accordingly, the current (base current) which flows through the interconnection 7 is much less than that (base current) which flows through the interconnections 8a or 8b. In the embodiment shown in FIG. 8, there are provided two VBB1 generating circuits and six input buffer circuits. However, since the number of the input buffer circuits is extremely increased in a large-capacity type semiconductor integrated circuit, the difference between the current which flows through the interconnection 7 and that which flows through the interconnection 8a or 8b is made much greater in practice. The base current which flows through the interconnection 7 is used only for the supply of the same to the bases of only a few bipolar transistors. Thus, the voltage drop $\Delta V7$ at the interconnection 7 becomes small negligibly as compared with the voltage drop caused by the current which flows through the interconnection 8a or 8b.

The VBB1 generating circuit 6a is provided adjacent to its corresponding input buffer 10c. Thus, the interconnection 8a used to supply the second reference potential VBB1 to each input buffer circuit 10c is significantly shorter than the interconnection 8 shown in FIG. 1, and hence the interconnection resistance thereof is reduced. In addition, the number of the bipolar transistors whose bases are connected to the interconnection 8a is also reduced as compared with that of those shown in FIG. 1.

Similarly, the interconnection 8b for the transfer of the VBB1 voltage, which extends out from the VBB1 generating circuit 6b, is also short and the number of the bipolar transistors connected to the interconnection 8b is also decreased. Accordingly, the voltage drop $_\Delta V8$ at the interconnection 8a or 8b is considerably reduced as compared with that $_\Delta V8$ at the interconnection 8 in the semiconductor integrated circuit shown in FIG. 1. In the case of a 64K×4 bit type ECL·RAM, for example, there are provided 22 input buffer circuits. Where the number of the VBB1 generating circuits connected to the interconnection 7 is two and the resistance of the interconnection 7 is 100 Ω, even for the worst case, namely, even if the VBB1 generating circuits 6a, 6b are connected in series to the interconnection 7, the voltage drop ΔV7 at the interconnection 7 becomes 0.01 V when the base current of one bipolar transistor is 0.01 mA.

Assuming that the resistance of each of the interconnections 8a, 8b is 50 Ω, the number of the input buffer circuits connected to the respective interconnections 8a, 8b is eleven and the base current required for each of the bipolar transistors is 0.05 mA, the voltage drop ΔV8 at the interconnection 8a or 8b becomes 0.03 V at the maximum from the relation of 0.05 mA·11·50 Ω. Namely, even when the voltage drops ΔV7 and ΔV8 at the interconnections 7 and 8 respectively are summed up together, the total voltage drop is 0.04 V at the maximum. This value, i.e., 0.04 V is reduced down by one order as compared with the maximum value 0.11 V of the voltage drop ΔV8 at the interconnection 8 in the conventional semiconductor integrated circuit shown in FIG. 1. The variation in the reference potential V(8), which exerts a great influence on the operating margin and the time delay of each of the input buffer circuits 10c, 10d, can significantly be suppressed. Therefore, the semiconductor integrated circuit having a wide operating margin and operable at high speed can be obtained.

The circuits supplied with the reference potential are not necessarily limited to the input buffer circuits referred to above. If ECL logic circuits are used in a semiconductor integrated circuit, the same effects as those obtained in the above-described embodiment can be obtained by grouping these ECL logic circuits.

The arrangement shown in FIG. 8 has shown where two VBB1 generating circuits are connected to one VBB0 generating circuit and three input buffer circuits are connected to one VBB1 generating circuit. If the relation that the number of the VBB1 generating circuits connected to one VBB0 generating circuit is less than that of the input buffer circuits connected to one VBB1 generating circuit is met, the number of the VBB1 generating circuits connected to one VBB0 generating circuit and the number of the input buffer circuits connected to one VBB1 generating circuit may be any.

In addition, the reference potential generating circuit is not necessarily limited to the circuit arrangement shown in FIG. 9. If the reference potential VBB1 is set such that it is kept constant regardless of the variation in the second supply voltage VEE, the same effects as those in the above-described embodiment can be obtained even when any circuit arrangement is adopted. Namely, if the circuit arrangement is set such that the constant current source 303 always supplies constant current even with the variation in the supply voltage VEE, any circuit arrangement may be used.

Figure 10:
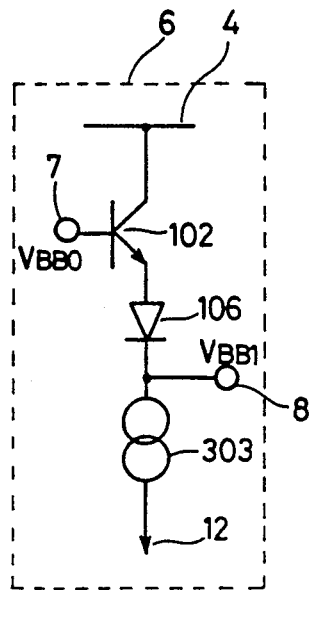
FIG. 10 is a diagram showing another arrangement of the second reference potential generating circuit according to the present invention.

FIG. 10 shows another example of a VBB1 generating circuit. In a VBB1 generating circuit 6 shown in FIG. 10, a diode 106 is connected in the forward direction between an npn bipolar transistor 102 supplied with the reference potential VBB0 through the interconnection from the VBB0 generating circuit 5 and the interconnection 8. In this case, the reference potential VBB0 is applied to the emitter follower transistor 102 where it is level-shifted by a base-emitter voltage VBE and further level-shifted by a forward drop voltage Vf (or VBE) with the diode 106. The voltage thus level-shifted in two stages is outputted as the reference potential VBB1.

Figure 11:
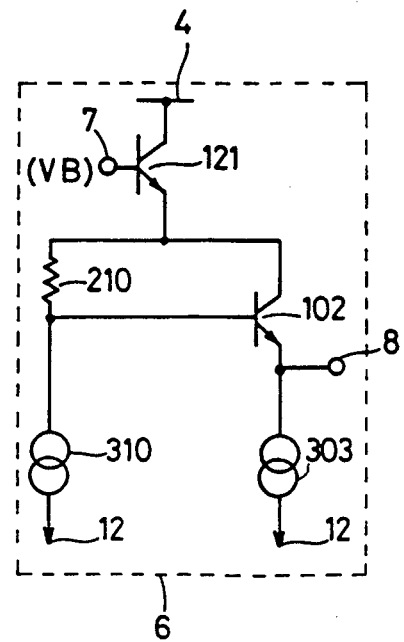
FIG. 11 is a diagram illustrating a further arrangement of the second reference potential generating circuit according to the present invention.

A circuit arrangement shown in FIG. 11 may be used as the VBB1 generating circuit 6.

The VBB1 generating circuit 6 shown in FIG. 11 includes an npn bipolar transistor 121 whose base receives a first reference potential VBB0 through an interconnection 7, a resistor 210 having one end connected to an emitter of the npn bipolar transistor 121 and the other end connected to a base of an npn bipolar transistor 102 and a constant current source 310, the npn bipolar transistor 102 having the collector connected to the emitter of the bipolar transistor 121, the base connected to the other end of the resistor 210 and the constant current source 310, and the emitter connected to an internal output interconnection 8, and a constant current source 303 connected between one of internal VEE interconnections 12 and the internal output interconnection 8. With this circuit arrangement, the reference potential VBB1 is outputted from the bipolar transistor 102 with the reference potential VBB0 being level-shifted by an emitter-base voltage drop VBE1 at the emitter follower transistor 121, a voltage drop across the resistor 210 and a base-emitter voltage drop at the bipolar transistor 102.

Figure 12:
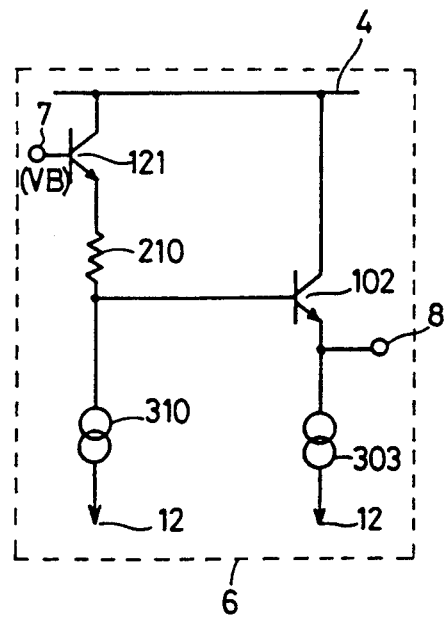
FIG. 12 is a diagram depicting a still further arrangement of the second reference potential generating circuit according to the present invention.

FIG. 12 shows a further example of the arrangement of a VBB1 generating circuit. The VBB1 generating circuit shown in FIG. 12 includes an npn bipolar transistor 121 whose base is supplied with a first reference potential VBB0 applied through an interconnection 7, an emitter resistor 210 connected to an emitter of the bipolar transistor 121, a constant current source 310 connected to one end of the resistor 210, an npn bipolar transistor 102 having the base connected to the other end of the resistor 210, the collector connected to an internal VCC interconnection 4 and the emitter connected to an internal output interconnection 8, and a constant current source 303 connected to the emitter of the npn bipolar transistor 102. Even with this arrangement, a desired second reference potential VBB1 generating circuit can be obtained in the same manner as the circuit shown in FIG. 11.

If a prescribed bias voltage VB is applied to the base of the bipolar transistor 121 and if the circuit composed of the resistor 210 and the constant current source 310 is used as a VBB0 generating circuit, in each of the circuit arrangements shown in FIGS. 11 and 12, the influence of the resistance of the internal VCC interconnection on the first reference potential VBB0 is reduced, so that a stabler reference potential VBB1 can be obtained. In this case, the influence of the resistance in the internal VCC interconnection on the first reference potential VBB0 may simply be controlled by the bias voltage VB, and the output from a VBB0 generating circuit 5 as shown in FIG. 13 can be used.

Figure 13:
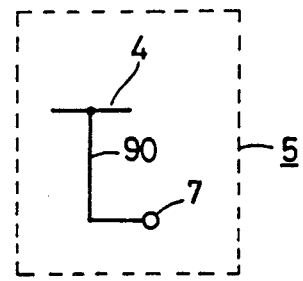
FIG. 13 is a diagram showing one example of the arrangement of the first reference potential generating circuit according to the present invention.

The VBB0 generating circuit 5 shown in FIG. 13 includes an interconnection 90 connected to the internal VCC interconnection 4. Namely, the interconnection 7 is directly connected to the internal VCC interconnection 4. Even in this case, the length of the interconnection 90 between the interconnection 7 and the internal VCC interconnection 4 is a minimum value. It is therefore possible to reduce the influence of the resistance in the interconnection 90. If the VBB0 generating circuit 5 shown in FIG. 13 is used, the interconnection may directly be connected to the base of the bipolar transistor 121 in the VBB1 generating circuits 6 shown in FIG. 11 or 12. Thus, the reference potential VBB0 is produced through the resistor 210, and the influence of the resistance in the internal VCC interconnection 4, i.e., the voltage drop $\Delta V4$ included in the reference potential VBB0 can be reduced to the minimum.

If an ECL input buffer circuit is so constructed that the logic threshold value is determined by the reference potential VBB1, any circuit arrangement may be used. Further, the present embodiment is not necessarily limited to the use of the ECL input buffer circuit. If the circuit arrangement is set up such that the input logic threshold value is determined by the reference potential VBB1, the same effects as those in the above-described embodiment can be obtained even when any of ECL, TTL or MOS logic circuit may be used.

A description will next be made of a circuit arrangement for eliminating the influence of the variations in the supply voltages VCC and VEE.

Figure 6:
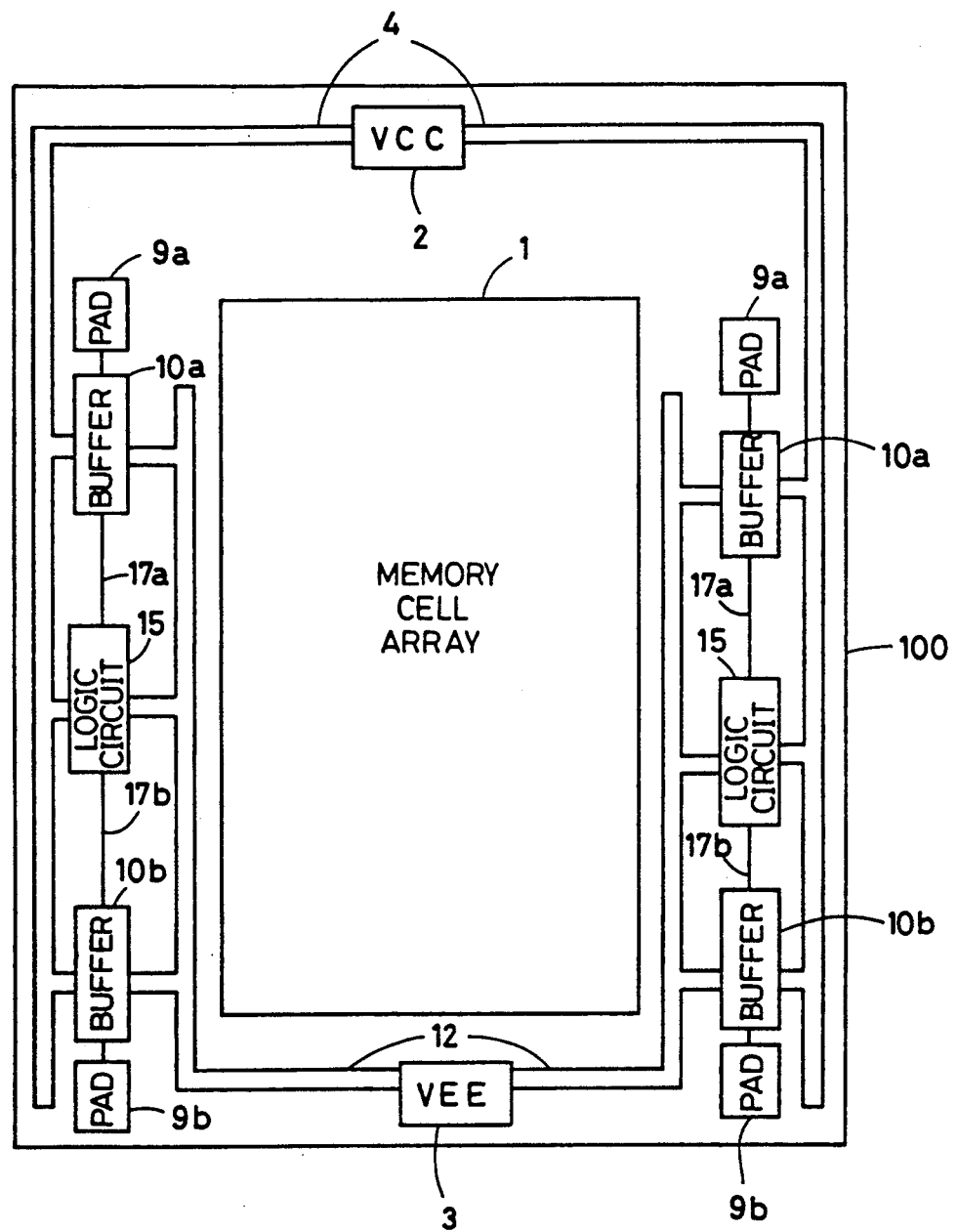
FIG. 6 is a schematic diagram showing the layout of another conventional semiconductor integrated circuit fabricated on a chip.
Figure 14:
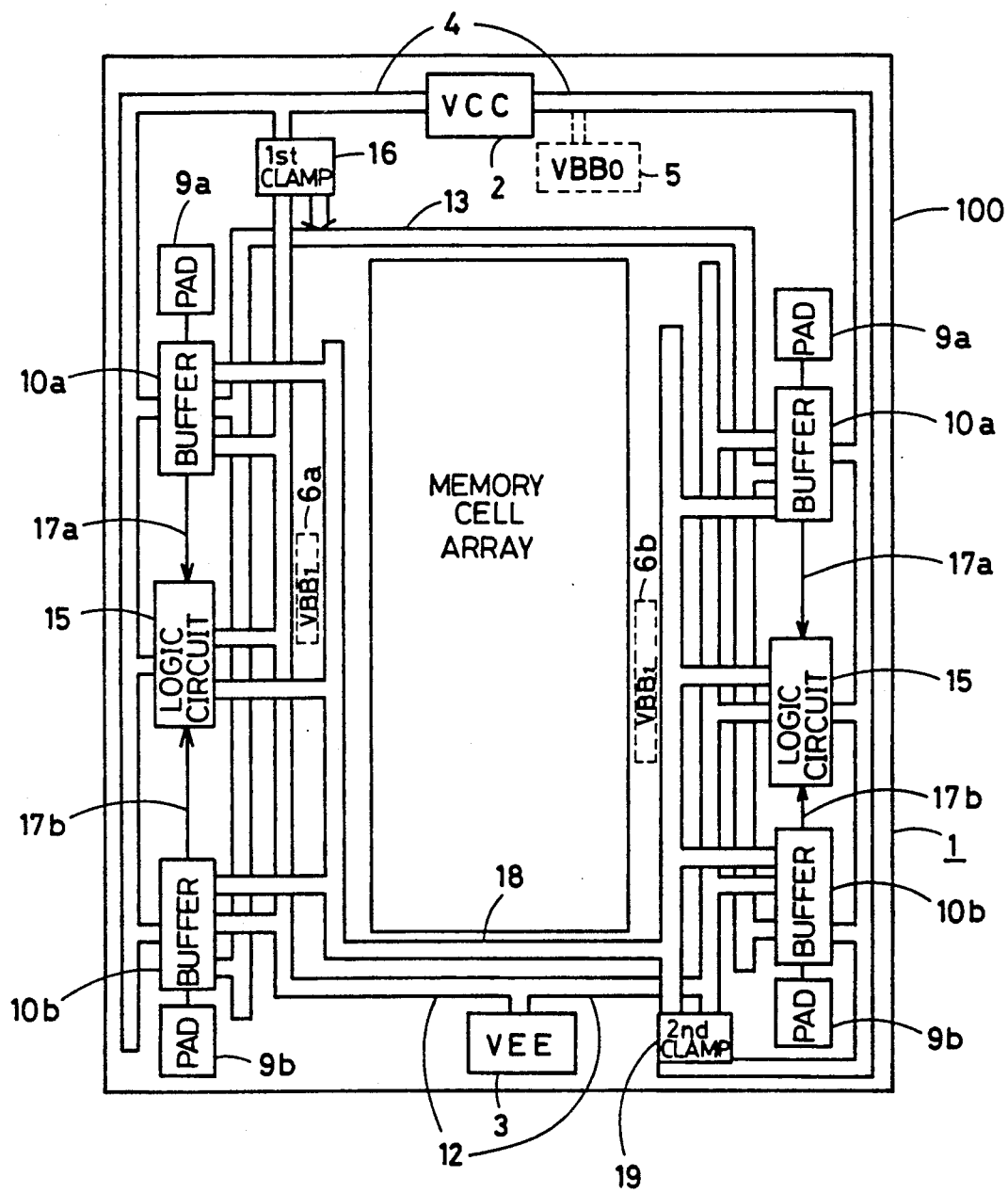
FIG. 14 is a schematic diagram depicting the layout of a semiconductor integrated circuit according to another embodiment of the present invention, which is fabricated on a chip.

FIG. 14 shows the layout on a chip of a semiconductor integrated circuit according to another embodiment of the present invention. The layout of the semiconductor integrated circuit corresponds to that of the semiconductor integrated circuit shown in FIG. 6. Referring to FIG. 14, the semiconductor integrated circuit includes a first clamping potential generating circuit 16 provided in the vicinity of a VCC pad 2 and supplied with a supply voltage from an internal VCC interconnection 4 and an internal VEE interconnection 12. The first clamping potential generating circuit 16 generates a clamping potential used to clamp the potential at one end of a resistor serving as a current/voltage converting means in each ECL logic circuit at a prescribed voltage. In addition, a second clamping potential generating circuit 19 is provided near a VEE pad 3 and supplied with an operating supply voltage from the internal VCC interconnection 4 and the internal VEE interconnection 12, for clamping the potential at a current-supply terminal of a constant current source included in each ECL logic circuit at a second clamping potential. The clamping potentials by the first and second clamping potential generating circuits 16, 19 are applied to input buffer circuits 10a, 10b and ECL logic circuits 15 through interconnections 13, 18, respectively. This circuit arrangement has shown the input buffer circuits 10a, 10b by way of illustrative example. However, any ECL logic circuit may be used instead of them.

Figure 7:
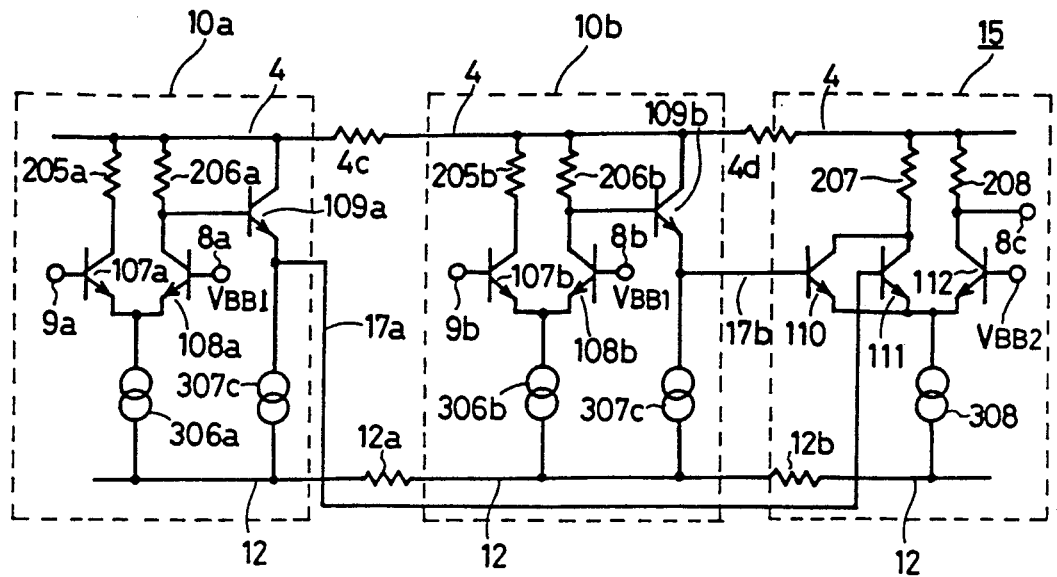
FIG. 7 is a diagram specifically illustrating the arrangement of an ECL logic circuit in the semiconductor integrated circuit shown in FIG. 6.
Figure 15:
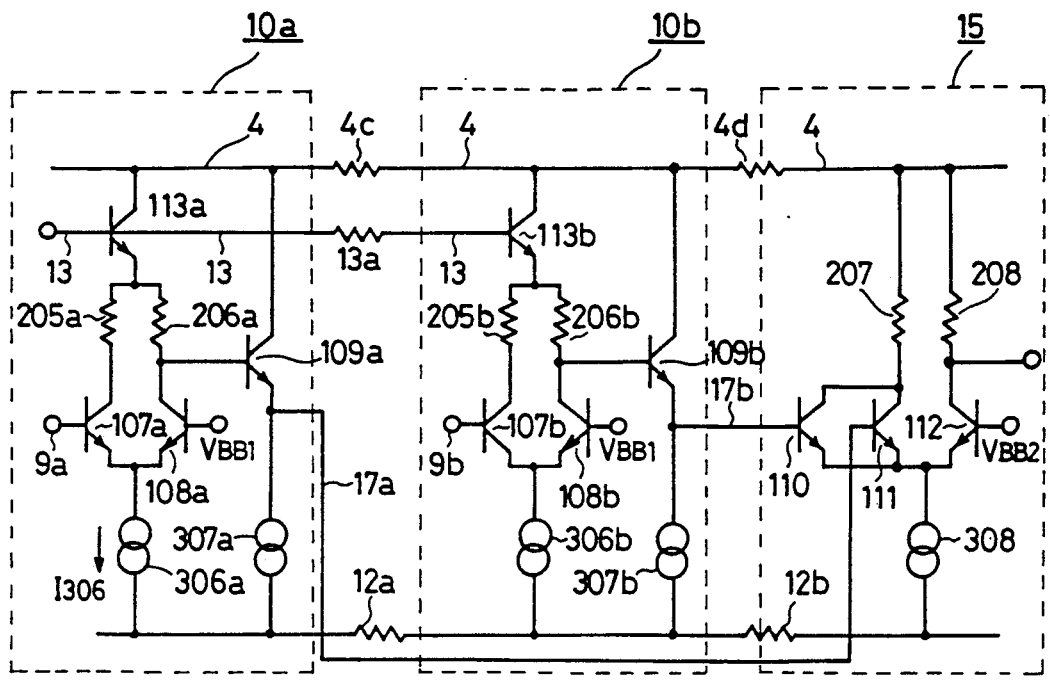
FIG. 15 is a diagram specifically showing one example of the arrangement of an ECL logic circuit employed in the semiconductor integrated circuit shown in FIG. 14.

FIG. 15 shows the arrangement of the input buffer circuits 10a, 10b and the internal ECL logic circuit 15. The circuit arrangement shown in FIG. 15 corresponds to that depicted in FIG. 7. The components corresponding to those employed in the circuit arrangement shown in FIG. 7 are identified by like reference numerals. As is apparent from the comparison between the circuit arrangement shown in FIG. 7 and that depicted in FIG. 15, the input buffer circuits 10a, 10b in the semiconductor integrated circuit according to the present invention include npn bipolar transistors 113a, 113b whose bases each are supplied with the first clamping potential fed from the first potential generating circuit 16 through a first internal clamping interconnection 13. The bipolar transistors 113a, 113b having the collectors each connected to the internal VCC interconnection 4 and the emitters connected to their associated resistors 205a, 206a and 205b, 206b.

The bipolar transistors 113a and 113b each serve to clamp the potential at one end of each of the resistors 205a, 206a serving as current/voltage converting means at a prescribed potential and to clamp the potential at one end of each of the resistors 205b, 206b as the current/voltage converting means at a prescribed voltage. The internal clamping interconnection 13 is accompanied by a interconnection resistance 13a. The other arrangement in the circuit arrangement shown in FIG. 15 is the same as that in the circuit arrangement shown in FIG. 7.

The second reference potential VBB1 and the third reference potential VBB2 are established such that the difference between the reference potential VBB1 and the supply voltage VCC and the difference between the reference potential VBB2 and the supply voltage VCC are kept constant at all times regardless of the variation in the second supply voltage VEE. The internal VEE interconnection 12 involves interconnection resistances 12a, 12b. The operation of the whole circuit shown in FIG. 15 will now be described.

The first clamping potential generating circuit 16 generates a clamping potential set in such a manner that the difference between the clamping potential thereof and the voltage VCC at the VCC interconnection 4 is kept constant regardless of the variation in the second supply voltage VEE, and then applies the clamping potential thus generated onto the interconnection 13. When a signal VIH of a high level is applied to an input signal pad 9a or 9b, a bipolar transistor 107a or 107b is brought into an "ON" state and a bipolar transistor 108a or 108b is brought into an "OFF" state if the level of the signal VIH is higher than that of the second reference potential VBB1. As a consequence, the potential at the collector of the bipolar transistor 108 (108a or 108b) in the input buffer circuit supplied with the high level signal is rendered high, so that the emitter of the bipolar transistor 109 (109a or 109b), i.e., an output 17a or 17b of the input buffer circuit 10a or 10b is brought into a high level. Let's now assume that the clamping potential generated by the first potential generating circuit 16 is V(16) and a voltage drop at the interconnection 13 is $\Delta$V13. In this case, the potential V (13) at the interconnection 13 is given by the following equation:

$$V(13) = V(16) - \Delta V13$$

If the base-emitter voltage of the bipolar transistor 113a (113b) is VBE, the potential at the emitter of the bipolar transistor 113a or 113b is clamped at $V(16) - VBE - \Delta V13$.

At this time, the high-level voltage V17H of the output 17a or 17b is given by the following equation:

$$V17H = V(16) - 2VBE - \Delta VBE - \Delta V13$$

When a signal VIL of a low level is applied to either input signal pad 9a or 9b, the bipolar transistor 107a or 107b is brought into an "OFF" state, and the bipolar transistor 108a or 108b is brought into an "ON" state if the level o this signal VIL is lower than that of the second reference potential VBB1. Thus, the potential at the collector of the bipolar transistor 108a or 108b is rendered low, so that the output 17a of the input buffer circuit 10a or the output 17b of the input buffer circuit 10b is brought into a low level.

Assuming that the resistance values of the resistors 206a, 206b are both R206 and the current which flows through each of constant current sources 306a, 306b is I306, the low-level voltage V17L of the output 17a or 17b is given by the following equation:

$$V17L = V(16) - R206 \cdot I306 - 2 \cdot VBE - \Delta V13$$

If the second reference potential VBB1 is established so as to be VIL<VBB1<VIH, the input buffer circuit 10a or 10b is normally operated. As described above, the switching speed of each of the input buffer circuit 10a and 10b is faster as the amplitude of each output thereof represented by the equation $V17H - V17L = R206 \cdot I306$ is decreased. The switching speed is slower as the second reference potential VBB1 is shifted from the central value between the voltage VIL of the low level and the voltage VIH of the high level.

If the current amplification rate hFE of the transistor 113 is sufficiently large in this case, only slight current flows through the interconnection 13 as compared with the current which flows through the internal power VCC interconnection. Since the interconnection 13 cannot have a width greater than that of the internal VCC interconnection, its resistance value becomes larger. However, the current which flows through the interconnection 13 is small, and the voltage drop $\Delta$V13 at the interconnection 13 becomes small negligibly. It is therefore possible to neglect the influence of the voltage drop $\Delta$V13 caused by the resistance of the interconnection 13 on the clamping potential V(13), and to produce a constant clamping potential V(13).

Similarly, if the potential at one end of each of the constant current sources 306a, 307a, 306b and 307b is clamped so as to be a prescribed potential, the current which flows therethrough is also small. It is thus possible to neglect the influence of the voltage drop caused by the interconnection resistance on the low level voltage of each of the outputs 17a and 17b similarly to the above case. Accordingly, the influence of the voltage drop at the VEE interconnection 12 can be eliminated. Such situation will now be described by specifically showing an arrangement of a clamping potential generating circuit.

Figure 16:
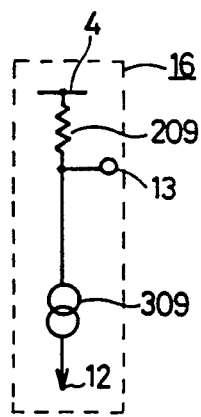
FIG. 16 is a diagram specifically showing the arrangement of a first clamping potential generating circuit according to the present invention.

FIG. 16 shows one example of the arrangement of the first clamping potential generating circuit. The first clamping potential generating circuit 16 shown in FIG. 16 includes a resistor 209 and a constant current source 309. The resistor 209 has one terminal connected to the internal VCC interconnection 4 and the other terminal connected to the constant current source 309 and an interconnection 13 for the supply of the clamping potential. The first clamping potential generating circuit 16 is provided near the VCC pad 2 as shown in FIG. 14. A voltage drop at the internal VCC interconnection 4, which has the influence on the clamping potential supplied from the resistor 209 to the interconnection 13, is a negligible value. The clamping potential V (16) at this case is given by the following equation:

$$V(16) = -R209 \cdot I309$$

where R209 shows a resistance value of the resistor 209 and I309 represents current which flows through the constant current source 309.

The current I309 produced by the constant current source 309 is kept constant without being affected by the variations in the supply voltages VEE and VCC.

Figure 17:
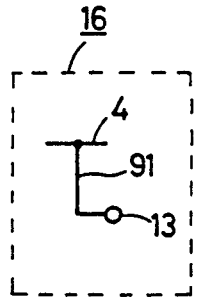
FIG. 17 is a diagram illustrating another arrangement of the first clamping potential generating circuit according to the present invention.

FIG. 17 is a diagram illustrating another arrangement of the first clamping potential generating circuit 16. In the first clamping potential generating circuit 16 shown in FIG. 17, an interconnection 13 is directly connected to an internal VCC interconnection 4. In this case, the clamping potential produced by the first clamping potential generating circuit 16 is the very voltage VCC which appears at the internal VCC interconnection 4. If the first clamping potential generating circuit 16 is provided near the VCC pad 2, the clamping potential is 0V.

A second supply voltage VEE for each of the first clamping potential generating circuits 16 shown in FIGS. 16 and 17 is supplied through the internal VEE interconnection 12. Each of the first clamping potential generating circuits 16 shown in FIGS. 16 and 17 supplies, to the interconnection 13, the clamping potential set such that the difference between the first clamping potential produced by each first clamping potential generating circuit and a first supply voltage VCC applied to the internal VCC interconnection 4 is kept constant against the variation in the second supply voltage VEE as a matter of course.

Figure 4A:
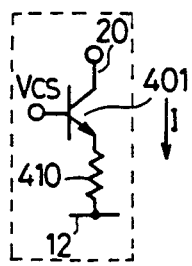
FIGS. 4A through 4C are diagrams depicting the arrangements of constant current circuits each of which is used in the conventional semiconductor integrated circuit.
Figure 4B:
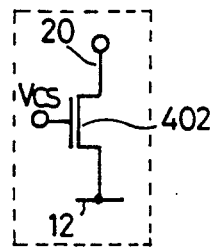
Figure 4C:
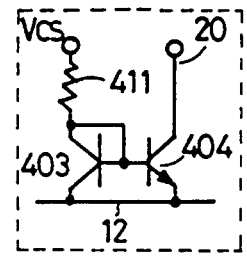
Figure 5:
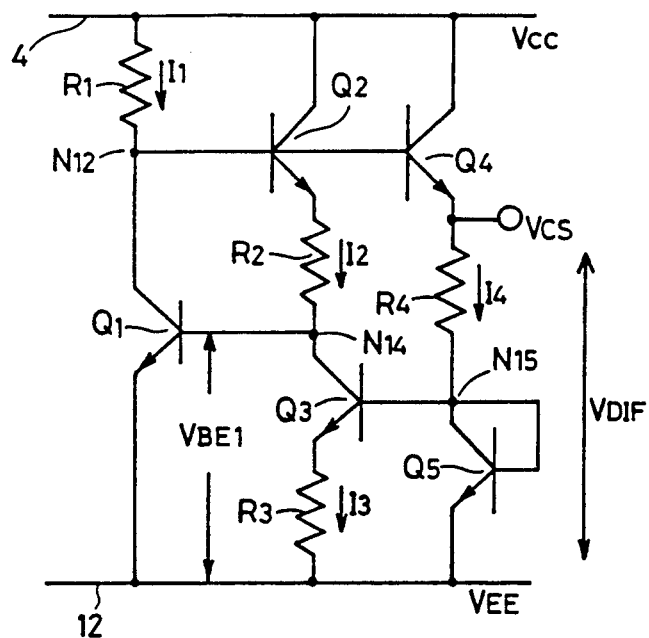
FIG. 5 is a diagram showing one example of the arrangement of a circuit for generating a bias voltage applied to a constant current circuit.
Figure 18A:
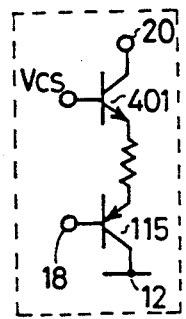
FIGS. 18A through 18C are diagram each showing the arrangement of a constant current circuit according to the present invention.
Figure 18B:
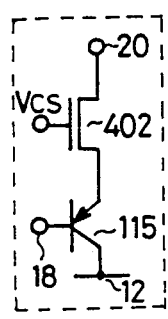
Figure 18C:
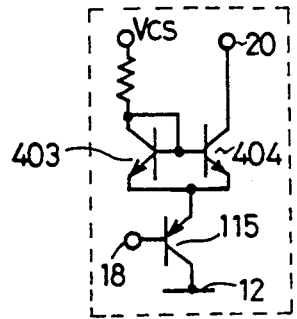
Figure 19:
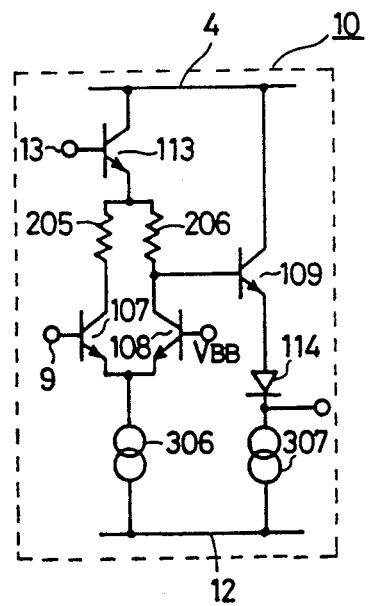
FIG. 19 is a diagram showing another arrangement of the ECL logic circuit according to the present invention.

FIGS. 18A through 18C are diagrams each showing the circuit arrangement of each of the constant current sources 306, 307, 308 and 309. FIGS. 18A, 18B and 18C show the circuits corresponding to constant current circuits shown in FIGS. 14A through 14C. Each of the constant current circuits supplies to a device connected to the current supply terminal 20. Constant current determined by the difference between a reference potential VCS and the potential at the emitter of each bipolar transistor 115, which reference potential VCS is set such that the voltage difference is kept constant with respect to the internal VEE interconnection 12. The bipolar transistor 115 is of a pnp bipolar transistor, which serves to clamp the potential at the emitter thereof based on the clamping potential applied to an interconnection 18 connected to the base thereof. A second clamping potential from a second clamping potential generating circuit 19 is supplied to the interconnection 18. The operation of each of the constant current sources shown in FIGS. 18A through 18C is the same as that of each of the constant current sources shown in FIGS. 4A through 4C. The reference potential VCS is set such that the difference, i.e., $VDIF = VEE - VCS$ between the second supply potential VEE supplied to the internal VEE interconnection 12 and the reference potential VCS is kept constant against the variation in the second supply voltage VEE. The reference potential VCS is produced by the VCS generating circuit shown in FIG. 5.

Figure 20:
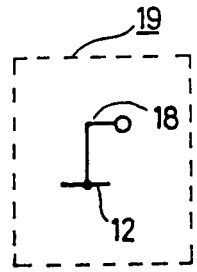
FIG. 20 is a diagram specifically showing one example of the arrangement of a second clamping potential generating circuit according to the present invention.

The clamping potential of the pnp bipolar transistor 115 is produced by the second clamping potential generating circuit 19 depicted in FIG. 20. In the second clamping potential generating circuit 19 in FIG. 20, the interconnection 18 is directly connected to the internal VBE interconnection 12. Accordingly, the pnp bipolar transistor 115 is so constructed that the base and collector thereof are connected directly to each other. This transistor 115 is operated in the same manner as a diode. Let's now assume that the base-emitter voltage of the pnp bipolar transistor 115 is VBEP and a drop in voltage at the interconnection 18 is $\Delta V18$. In this case, the potential at the emitter of the pnp bipolar transistor 115 is clamped to the total voltage given by the following expression:

$$VEE + VBEP + \Delta V18$$

Constant current I to be supplied to the current supply terminal 20 of each of the constant current sources shown in FIGS. 18A through 18C is determined by the difference between the reference potential VCS and the potential at the emitter of each pnp bipolar transistor 115. If the constant current source shown in FIG. 18A is used in which a proportional constant is "a", then the constant current I is given by the following equation:

$$I = a \cdot (-VEE - VBEP - VBE - \Delta V18 + VCS)$$
$$= a \cdot (VDIF - VBEP - VBE - \Delta V18)$$

If the constant current source illustrated in FIG. 18B is used, when the constant current I is given by the following equation:

$$I = a' \cdot (VDIF - VBEP - \Delta V18)^2$$

If the constant current source depicted in FIG. 18C is employed, then the constant current I is given by the following equation:

$$I = a'' \cdot (VDIF - VBEP - VBE - \Delta V18)$$

Where the constant current source shown in FIG. 18A is used as each of the constant current source of 306a, 306b, 307a, 307b and 308, and the first clamping potential generating circuit depicted in FIG. 17 is employed as the first clamping potential generating circuit, the clamping potential V (16) is equal to 0. Therefore, the low-level voltage V17L of each of the outputs 17a, 17b in the input/output buffer circuits 10a, 10b is represented by the following equation:

$$V17L = -a \cdot R206 \cdot (VDIF - VBEP - VBE - \Delta V18) - 2 \cdot VBE - \Delta V13$$

The high-level voltage V17H of each of the outputs 17a and 17b is expressed by:

$$V17H = -2VBE - \Delta V13$$

The current flowing through the interconnections 13, 18, is the base current which flows into each of the bipolar transistors 113a, 113b and the base current which flows into the npn bipolar transistor 115. If the current amplification rate hFE of each of the bipolar transistors 113 and 115 is sufficiently large, the base current thereof is extremely small negligibly as compared with the current which flows through the internal VCC interconnection 4 and the internal VEE interconnection 12. Each of the interconnections 13, 18 has a width narrower than that of each of the internal VEE interconnection 12 and the internal VCC interconnection 4, and its resistance value is large. However, since the current which flows through the interconnections 13, 18 is extremely small, the voltage drops $\Delta V13$ and $\Delta V18$ at the interconnections 13 and 18 respectively become small negligibly.

Let's now assume that the resistance of each of the interconnections 13, 18 between the input buffer circuits 10a and 10b is 100 Ω, the value of the current which flows through each of the interconnections 13 and 18 is 0.1 mA. In this case, the relationship between the voltage drops $\Delta V13$ and $\Delta V18$ are represented by the following equation:

$$\Delta V13 = \Delta V18 \approx 0.01 \ V$$

It can be appreciated that the voltage drops $\Delta V13$ and $\Delta V18$ at the interconnections 13, 18 respectively is small negligibly as compared with the base-emitter voltage VBE(0.8 V or so) and the VDIF (+1.8 V or so; lets here assume that all the base-emitter voltages VBEs at the transistors Q1 through Q5 be equal to each other).

Accordingly, if the potential at one terminal of the resistor as the current/voltage converting means in each of the input buffer circuits and the potential at a terminal supplied with the current from each of the constant current sources are clamped at the first and second clamping potentials by the first and second clamping potential generating circuits 16, 19, respectively, the influence of the voltage drops caused by the interconnection resistance on the output level of each of the input buffer circuits can be neglected. It is therefore unnecessary to take into consideration the variation in the output level of each of the buffer circuits 10a, 10b, which is caused by the interconnection resistances according to positions on a semiconductor chip. In addition, the amplitude of the output from each of the input buffer circuits 10a, 10b can be reduced down to the critical value of the range determined by the performance of a VBB2 generating circuit, in which an ECL logic circuit 15 is operated normally. The operating speed of each of the input buffer circuits 10a, 10b and the ECL logic circuit 15 can also be rendered high. If the output amplitude of each of the input buffer circuits 10a, 10b is set so as to be a value of the same order as the value of the output amplitude in the conventional semiconductor integrated circuit, the operating margin of the ECL logic circuit 15 can sufficiently be ensured.

Each of the input buffer circuit 10a, 10b shown in FIG. 15 directly generates the output from the emitter of the level-shifting emitter follower transistor 109. However, even when the input buffer circuit is constructed such that the potential at the emitter of the emitter follower transistor 109 is further level-shifted by means of a diode 114 to produce an output, the same effects as those obtained in the above-described embodiment can be achieved.

Further, the first clamping potential generating circuit 16 is not necessarily limited to the circuit arrangement shown in each of FIGS. 16 and 17. As far as the circuit arrangement is such that the emitter of each of the bipolar transistors, to which the output V (16) of the first clamping potential generating circuit is supplied, is clamped to a predetermined potential which is not affected by the variation in the second supply voltage VEE, any circuit arrangement may be used. In this case, the same effects as those in the above-described embodiment can be obtained.

The second clamping potential generating circuit 19 is also unnecessarily limited to the circuit arrangement shown in FIG. 20. As far as the circuit arrangement is such that the voltage at the emitter of each bipolar transistor 115 which is supplied with the output of the second clamping potential generating circuit 19, is kept constant while the variation in the second supply voltage VEE does not influence on the difference between the voltage at its emitter and the second supply voltage VEE, the same effects as those in the above-described embodiment can be obtained.

In addition, in the above-described embodiment the arrangement and operation of the signal input circuitry of the ECL·RAM by way of example have been discussed. However, the present invention is not necessarily limited to the signal input circuitry. As an alternative, a signal output circuitry for an internal signal processing circuitry may be used.

The semiconductor integrated circuit is not necessarily limited to ECL·RAM. If a logic circuit including a current switching circuit for switching a current path by a given signal is adopted, the same effects as those in the above-described embodiment can be obtained whatever circuit is used.

As described above, according to the first aspect of this invention, the first reference potential generating circuit is provided near the first supply-voltage input pad, and the logic circuitry is divided into groups. Then, the second reference potential generating circuit is provided for each group and disposed near an associated logic circuit group. Therefore, the resistance of the first interconnection between the first reference potential generating circuit and the first supply-voltage input pad can be set to the minimum, and hence the voltage drop at the first interconnection region can be set to a negligible value. In addition, the resistance of the third interconnection used to supply the second reference potential to the associated logic circuit from the second reference potential generating circuit can be rendered smaller than that of the second interconnection used to supply the first reference potential fed from the first reference potential generating circuit to the second reference potential generating circuit. The number of the transistors each of which consumes the current flowing through the second interconnection can be set to substantially the same as that of the second reference potential generating circuits, and the voltage drop at the second interconnection can significantly be reduced. Since the resistance of the third interconnection is small, the voltage drop at the third interconnection is also small. It is therefore possible to obtain the semiconductor integrated circuit of the type that the influence of the voltage drop caused by the interconnection resistance on the second reference potential can be suppressed, the operating margin of the logic circuit operating with the use of the second reference potential as the logic threshold value can be widened, and a delay time of a signal in the logic circuit can be minimized.

According to the second aspect of this invention, the level of an output from a logic circuit is determined by the clamping potential used in such a manner that the difference between the first reference potential and the first supply voltage is set to a predetermined value regardless of the variation in the second supply voltage. It is therefore possible to restrain the influence of the voltage drop in the first supply voltage, which is caused by the resistance of the first power supply interconnection, on the output level of the logic circuit.

According to the third aspect of this invention, the voltage between the constant current circuit and the second power supply interconnection is clamped by a clamping potential set such that the clamping potential relative to the second power supply potential is set to a predetermined value regardless of the variation in the second supply voltage. It is therefore, possible to suppress the influence of the voltage drop in the second supply voltage, which is caused by the resistance of the second power supply interconnection, on the output level of a logic circuit.

According to the arrangement of each of the first, second and third aspects of this invention, it is possible to obtain the semiconductor integrated circuit having a widened operating margin of the logic circuitry and a high-speed response characteristic.

As has been described above, according to the first to third aspects of this invention, it is possible to obtain a high-speed operable and large-capacity semiconductor integrated circuit, which can control the influence of the voltage drop caused by the interconnection resistance on the operating margin and speed of the logic circuitry, and has a wide operating margin, a high-speed switching operation and a reduced output amplitude.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit including a first pad for receiving a first power supply voltage and a second pad for receiving a second power supply voltage, comprising:

first reference potential generating means provided near said first pad and supplied with said first power supply voltage from said first pad through a first interconnection, for generating a first reference potential;

a plurality of second reference potential generating means each supplied with said first reference potential from said first reference potential generating means through a second interconnection, for generating a second reference potential from said first reference potential thus supplied; and a plurality of logic circuit means provided in groups, one group for each of said plurality of second reference potential generating means;

said plurality of logic circuit means each including circuit means for logically processing a receiving signal using the second reference potential received from the associated second reference potential generating means through an associated third interconnection as the logic threshold value;

said second reference potential generating means each being provided near an associated grouped logic circuit means in such a manner that the resistance of the associated third interconnection is smaller than that of the related second interconnection, wherein said circuit means includes:

current-mode operating circuit means including one end and the other end and for switching a current path between said one end and the other end according to the magnitudes of both the potential of a received signal and said second reference potential;

current/voltage converting element means having one node and the other node and for converting current which flows through said current-mode operating circuit means into a voltage, said one node of said current/voltage converting element means being connected to said one end of said current-mode operating circuit means; and clamping means for clamping the potential at said other node of said current/voltage converting element means at a predetermined potential, said clamping means including means which clamp the potential at said other node of said current/voltage converting element means in such a manner that the difference between said first reference potential and said clamping potential is brought into a constant potential independent of the variation in said second reference potential.

2. A semiconductor integrated circuit including a first pad for receiving a first power supply voltage and a second pad for receiving a second power supply voltage, comprising:

first reference potential generating means provided near said first pad and supplied with said first power supply voltage from said first pad through a first interconnection, for generating a first reference potential;

a plurality of second reference potential generating means each supplied with said first reference potential from said first reference potential generating means through a second interconnection, for generating a second reference potential from said first reference potential thus supplied; and a plurality of logic circuit means provided in groups, one group for each of said plurality of second reference potential generating means;

said plurality of logic circuit means each including circuit means for logically processing a received signal using the second reference potential received from the associated second reference potential generating means through an associated third interconnection as the logic threshold value;

said second reference potential generating means each being provided near an associated grouped logic circuit means in such a manner that the resistance of the associated third interconnection is smaller than that of the related second interconnection, wherein said circuit means includes:

current-mode operating circuit means including a first node connected to receive said first power supply voltage on said first interconnection and a second node, for switching a current path between said first node and said second node according to the magnitudes of both said second reference potential and the potential of a received signal;

constant current supply circuit means having one node connected to said second node and the other node connected to receive said second supply voltage through said fourth interconnection and for supplying a constant current to said current-mode operating circuit means; and clamping means for clamping the potential at said one node of said constant current supply circuit means at a predetermined voltage, said clamping means serving to clamp the potential at said one node of said constant current supply circuit means in such a manner that the difference between said clamping potential at said one node of said constant current supply circuit means and the voltage at said other node of said constant supply circuit means is brought into a constant voltage independent of the valve of said second power supply potential on said fourth interconnection.

3. A semiconductor integrated circuit including a first pad supplied with a first supply voltage and a second pad supplied with a second supply voltage, comprising:

logic circuit means having one end supplied with current from said first supply voltage fed through said first pad and for outputting a signal having a different voltage level according to an input signal applied to an input node thereof;

constant current supply circuit means for supplying a constant current to an other end of said logic circuit means;

means for generating a first reference potential from said first supply voltage, the difference between said first reference potential and said first supply voltage being set to a constant value regardless of the variation said second supply voltage; and clamping circuit means for clamping a potential at said one end of said logic circuit means to a predetermined potential in response to said generated first reference potential, the clamping potential by said clamping circuit means being determined by said first reference potential, and the difference between said clamping potential and said first supply potential being set to a constant value regardless of the variation in said second supply voltage.

4. A semiconductor integrated circuit according to claim 3, wherein said first reference potential generating means includes a clamping potential generating circuit provided near said first pad.

5. A semiconductor integrated circuit according to claim 4, wherein said clamping potential generating circuit includes one conductive interconnection connected to said first pad.

6. A semiconductor integrated circuit according to claim 3, further comprising means provided near said first pad to generate a second reference potential from said first supply voltage, and means supplied with said second reference potential through a first interconnection to generate a third reference potential therefrom, wherein said logic circuit means include circuit means which serves to perform a thresholding of an input signal applied at said input node, using said third reference potential as the logic threshold value.

7. A semiconductor integrated circuit according to claim 3, further comprising means for generating a second reference potential from said first supply voltage, wherein said logic circuit means comprise:
 current-mode operating circuit means having one end and an other end and for switching a current path between said one end and the other end according to the magnitudes of both the potential of an input signal applied at said input node and said second reference potential;
 constant current supply circuit means connected to said other end of said current-mode operating circuit means for supplying a constant current to said current-mode operating circuit means; and
 current/voltage converting element means each having one end connected to said one end of said current-mode operating circuit means and an other end and for supplying current to said current-mode operating circuit means from said first supply voltage through said other end thereof and for converting current which flows through said current-mode operating circuit means into a voltage;
 said clamping circuit means including means for clamping the potential at said other end of said current/voltage converting element means at said clamping potential.

8. A semiconductor integrated circuit according to claim 3, wherein said clamping circuit means include element means for level-shifting said first reference potential for supply to said other end of said current-/voltage converting element means.

9. A semiconductor integrated circuit according to claim 3, further comprising means for generating a second reference potential in response to said first supply voltage, wherein said logic circuit means comprises:
 current-mode operating circuit means having a first node connected to receive said first supply voltage and a second node for switching a current path between said first node and said second node according to the magnitudes of both the potential of a signal applied to said input node and said second reference potential; and
 constant current supply circuit means for supplying constant current to said current-mode operating circuit means through a third node;
 and wherein said semiconductor integrated circuit further includes second means, provided near said second pad, for generating a second reference potential in response to said second supply voltage, and second clamping circuit means for clamping the potential at said third node at a third clamping potential in response to said second reference potential, the difference between said third clamping potential and the potential at a fourth node being set to a constant value regardless of the variation in said second supply voltage.

10. A semiconductor integrated circuit including a first pad receiving an a first supply voltage and a second pad receiving a second supply voltage, comprising:
 logic means having one end supplied with current from said first supply voltage fed via said first pad and for performing on an input signal applied to an input node of said logic means a prescribed logic processing;
 means for generating a first reference potential from said second supply voltage received through said second pad, the difference between said first reference potential and said second supply voltage being set to a constant value regardless of the variation in said second supply voltage;
 constant current circuit means having one end supplied with current from said second supply voltage and for supplying a constant current from the other end thereof to the other end of said logic circuit means in response to said first reference potential;
 second reference potential generating means for generating a second reference potential from said second supply voltage, the difference between said second reference potential and said second supply voltage being set to a constant value regardless of the variation in said second supply voltage; and
 clamping means for clamping the potential at said one end of said constant current circuit means to a predetermined voltage in response to said second reference potential, the clamping potential produced by said clamping means being set to a constant value regardless of the variation in said second supply voltage.

11. A semiconductor integrated circuit according to claim 10, wherein said clamping means includes a transistor element having one conduction terminal connected to a conductive interconnection used to supply said second supply voltage, the other conduction terminal connected to said one end of said constant current circuit means, and a control terminal connected to receive said second reference potential.

12. A semiconductor integrated circuit according to claim 10, wherein said second reference potential generating means is provided near said second pad.

13. A semiconductor integrated circuit according to claim 10, wherein said logic means includes current-mode operating circuit means for switching a current path between said one end thereof and the other end thereof according to the magnitudes of both the potential of a signal applied to said input node and a third reference potential, and wherein said semiconductor integrated circuit further includes:
 means provided near said first pad for generating a fourth reference potential in response to said first supply voltage; and
 means provided near said logic means for generating said third reference potential in response to said fourth reference potential.

14. A semiconductor integrated circuit according to claim 13, wherein said third reference potential generating means is provided one for a plurality of said logic means.

15. A semiconductor integrated circuit according to claim 10, further including means provided near said first pad for generating a third reference potential in response to said first supply voltage, the difference between said third reference potential and said first supply potential being a value regardless of the variation in said second supply voltage, and means for clamping the potential at said one end of said logic means at a fourth potential in response to said third reference potential.

16. A semiconductor integrated circuit according to claim 15, wherein said means for clamping includes for a level-shifting element (113) for level-shifting said third reference potential for supply to said one end of said logic means.

17. A semiconductor integrated circuit, comprising:
a pad for receiving a supply voltage and formed on a semiconductor substrate;
a circuit means including a logic portion and a supply voltage clamping means, said logic portion having an input node, an output node and a supply node and formed on said substrate;
said supply voltage clamping means having first and second main electrodes and a control node, said first main electrode connected electrically to said pad receiving said supply voltage through a first interconnection conductive layer, said second main electrode connected electrically to the supply node of said circuit means through a second interconnection conductive layer, said control node connected electrically to said pad receiving said external supply voltage through a third interconnection conductive layer being a layer different from said first interconnection layer.

18. A semiconductor integrated circuit, comprising:
a pad for receiving a supply voltage and formed on a semiconductor substrate;
a circuit means including a logic portion and a supply voltage clamping means, said logic portion having an input node, an output node and a supply node and formed on said substrate;
said supply voltage clamping means having first and second main electrodes and a control node, said first main electrode thereof electrically connected to said pad receiving said supply voltage through a first interconnection conductive layer, and said second main electrode electrically connected to the supply node of said circuit means through a second interconnection conductive layer; and
a reference potential generating means for generating a reference potential and applying said generated reference potential to the control node of said supply voltage clamping means through a third interconnection conductive layer, said reference potential having a constant potential difference with respect to said supply voltage.

* * * * *